(12) United States Patent
Bauer

(10) Patent No.: US 8,809,170 B2
(45) Date of Patent: Aug. 19, 2014

(54) HIGH THROUGHPUT CYCLICAL EPITAXIAL DEPOSITION AND ETCH PROCESS

(75) Inventor: Matthias Bauer, Phoenix, AZ (US)

(73) Assignee: ASM America Inc., Phoenix, AZ (US)

( * ) Notice: Subject to any disclaimer, the term of this patent is extended or adjusted under 35 U.S.C. 154(b) by 178 days.

(21) Appl. No.: 13/111,917

(22) Filed: May 19, 2011

(65) Prior Publication Data

US 2012/0295427 A1 Nov. 22, 2012

(51) Int. Cl.
*H01L 21/20* (2006.01)
*H01L 21/36* (2006.01)

(52) U.S. Cl.
USPC ............ 438/494; 438/503; 438/504; 438/507

(58) Field of Classification Search
None
See application file for complete search history.

(56) References Cited

U.S. PATENT DOCUMENTS

| | | | |
|---|---|---|---|
| 4,058,430 A | 11/1977 | Suntola et al. |
| 4,210,925 A | 7/1980 | Morcom et al. |
| 4,413,022 A | 11/1983 | Suntola et al. |
| 4,521,952 A | 6/1985 | Riseman |
| 4,578,142 A | 3/1986 | Corboy, Jr. et al. |
| 4,605,947 A | 8/1986 | Price et al. |
| 4,698,316 A | 10/1987 | Corboy, Jr. et al. |
| 4,704,186 A | 11/1987 | Jastrzebski |
| 4,710,241 A | 12/1987 | Komatsu |
| 4,728,623 A | 3/1988 | Lu et al. |
| 4,735,918 A | 4/1988 | Parsons et al. |
| 4,747,367 A | 5/1988 | Posa |
| 4,749,440 A | 6/1988 | Blackwood et al. |
| 4,749,441 A | 6/1988 | Christenson et al. |
| 4,758,531 A | 7/1988 | Beyer et al. |
| 4,761,269 A | 8/1988 | Conger et al. |
| 4,778,775 A | 10/1988 | Tzeng |
| 4,786,615 A | 11/1988 | Liaw et al. |
| 4,793,872 A | 12/1988 | Meunier et al. |
| 4,834,809 A | 5/1989 | Kakihara |
| 4,857,479 A | 8/1989 | McLaughlin et al. |

(Continued)

FOREIGN PATENT DOCUMENTS

| DE | 19820147 A1 | 7/1999 |
|---|---|---|
| JP | 59004040 | 1/1984 |

(Continued)

OTHER PUBLICATIONS

Office Action dated Oct. 9, 2012 in Japanese Application No. 2009-514271.

(Continued)

*Primary Examiner* — Scott B Geyer
(74) *Attorney, Agent, or Firm* — Knobbe, Martens, Olson & Bear, LLP

(57) ABSTRACT

Methods of selective formation leave high quality epitaxial material using a repeated deposition and selective etch process. During the deposition process, an inert carrier gas is provided with a silicon-containing source without hydrogen carrier gas. After depositing silicon-containing material, an inert carrier gas is provided with an etchant to selectively etch deposited material without hydrogen. The deposition and etch processes can be repeated until a desired thickness of silicon-containing material is achieved. Using the processes described within, it is possible to maintain temperature and pressure conditions, as well as inert carrier gas flow rates, to provide for increased throughput. The inert flow can be constant, or etch rates can be increased by reducing inert flow for the etch phases of the cycles.

34 Claims, 8 Drawing Sheets

(56) References Cited

U.S. PATENT DOCUMENTS

| | | |
|---|---|---|
| 4,870,030 A | 9/1989 | Markunas et al. |
| 4,873,205 A | 10/1989 | Critchlow et al. |
| 4,891,092 A | 1/1990 | Jastrzebski |
| 4,897,366 A | 1/1990 | Smeltzer |
| 4,923,826 A | 5/1990 | Jastrzebski et al. |
| 4,966,861 A | 10/1990 | Mieno et al. |
| 4,981,811 A | 1/1991 | Feygenson et al. |
| 4,994,402 A | 2/1991 | Chiu |
| 5,004,705 A | 4/1991 | Blackstone |
| 5,011,789 A | 4/1991 | Burns |
| 5,028,973 A | 7/1991 | Bajor |
| 5,032,233 A | 7/1991 | Yu et al. |
| 5,037,775 A | 8/1991 | Reisman |
| 5,043,300 A | 8/1991 | Nulman |
| 5,045,494 A | 9/1991 | Choi et al. |
| 5,059,544 A | 10/1991 | Burghartz et al. |
| 5,061,644 A | 10/1991 | Yue et al. |
| 5,061,655 A | 10/1991 | Ipposhi et al. |
| 5,071,670 A | 12/1991 | Kelly |
| 5,084,406 A | 1/1992 | Rhodes et al. |
| 5,094,977 A | 3/1992 | Yu et al. |
| 5,112,439 A | 5/1992 | Reisman et al. |
| 5,129,958 A | 7/1992 | Nagashima et al. |
| 5,144,376 A | 9/1992 | Kweon |
| 5,146,304 A | 9/1992 | Yue |
| 5,147,819 A | 9/1992 | Yu et al. |
| 5,148,604 A | 9/1992 | Bantien |
| 5,158,644 A | 10/1992 | Cheung et al. |
| 5,164,813 A | 11/1992 | Blackstone et al. |
| 5,175,121 A | 12/1992 | Choi et al. |
| 5,182,619 A | 1/1993 | Pfiester |
| 5,187,122 A | 2/1993 | Bonis |
| 5,196,360 A | 3/1993 | Doan et al. |
| 5,201,995 A | 4/1993 | Reisman et al. |
| 5,211,796 A | 5/1993 | Hansen |
| 5,231,056 A | 7/1993 | Sandhu |
| 5,234,857 A | 8/1993 | Kim et al. |
| 5,236,546 A | 8/1993 | Mizutani |
| 5,236,865 A | 8/1993 | Sandhu et al. |
| 5,252,841 A | 10/1993 | Wen et al. |
| 5,269,876 A | 12/1993 | Mizutani |
| 5,278,098 A | 1/1994 | Wei et al. |
| 5,282,926 A | 2/1994 | Trah et al. |
| 5,285,089 A | 2/1994 | Das |
| 5,319,220 A | 6/1994 | Suzuki et al. |
| 5,323,032 A | 6/1994 | Sato et al. |
| 5,324,679 A | 6/1994 | Kim et al. |
| 5,326,992 A | 7/1994 | Yoder |
| 5,341,016 A | 8/1994 | Prall et al. |
| 5,356,510 A | 10/1994 | Pribat et al. |
| 5,373,806 A | 12/1994 | Logar |
| 5,378,641 A | 1/1995 | Cheffings |
| 5,378,901 A | 1/1995 | Nii |
| 5,380,370 A | 1/1995 | Niino et al. |
| 5,389,575 A | 2/1995 | Chin et al. |
| 5,403,434 A | 4/1995 | Moslehi |
| 5,403,751 A | 4/1995 | Nishida et al. |
| 5,416,354 A | 5/1995 | Blackstone |
| 5,421,957 A | 6/1995 | Carlson et al. |
| 5,422,302 A | 6/1995 | Yonehara et al. |
| 5,422,502 A | 6/1995 | Kovacic |
| 5,425,842 A | 6/1995 | Zijlstra |
| 5,470,799 A | 11/1995 | Itoh et al. |
| 5,480,814 A | 1/1996 | Wuu et al. |
| 5,496,745 A | 3/1996 | Ryum et al. |
| 5,508,212 A | 4/1996 | Wang et al. |
| 5,508,536 A | 4/1996 | Twynam et al. |
| 5,512,772 A | 4/1996 | Maeda et al. |
| 5,517,943 A | 5/1996 | Takahashi |
| 5,557,117 A | 9/1996 | Matsuoka et al. |
| 5,557,118 A | 9/1996 | Hashimoto |
| 5,563,085 A | 10/1996 | Kohyama |
| 5,591,492 A | 1/1997 | Hirai et al. |
| 5,609,721 A | 3/1997 | Tsukune et al. |
| 5,656,519 A | 8/1997 | Mogami |
| 5,656,546 A | 8/1997 | Chen et al. |
| 5,670,404 A | 9/1997 | Dai |
| 5,670,801 A | 9/1997 | Nakano |
| 5,674,781 A | 10/1997 | Huang et al. |
| 5,683,922 A | 11/1997 | Jeng et al. |
| 5,693,147 A | 12/1997 | Ward et al. |
| 5,711,811 A | 1/1998 | Suntola et al. |
| 5,729,033 A | 3/1998 | Hafizi |
| 5,756,394 A | 5/1998 | Manning |
| 5,766,999 A | 6/1998 | Sato |
| 5,769,950 A | 6/1998 | Takasu et al. |
| 5,783,495 A | 7/1998 | Li et al. |
| 5,798,278 A | 8/1998 | Chan et al. |
| 5,831,335 A | 11/1998 | Miyamoto |
| 5,856,237 A | 1/1999 | Ku |
| 5,859,447 A | 1/1999 | Yang et al. |
| 5,879,459 A | 3/1999 | Gadgil et al. |
| 5,888,903 A | 3/1999 | O'Brien et al. |
| 5,899,752 A | 5/1999 | Hey et al. |
| 5,904,565 A | 5/1999 | Nguyen et al. |
| 5,916,365 A | 6/1999 | Sherman |
| 5,926,743 A | 7/1999 | Xi et al. |
| 5,933,761 A | 8/1999 | Lee |
| 5,945,350 A | 8/1999 | Violette et al. |
| 5,967,794 A | 10/1999 | Kodama |
| 5,986,287 A | 11/1999 | Eberl et al. |
| 5,998,305 A | 12/1999 | Holmer et al. |
| 6,031,255 A | 2/2000 | Delage et al. |
| 6,037,258 A | 3/2000 | Liu et al. |
| 6,042,654 A | 3/2000 | Comita et al. |
| 6,043,519 A | 3/2000 | Shealy et al. |
| 6,048,790 A | 4/2000 | Iacoponi et al. |
| 6,049,098 A | 4/2000 | Sato |
| 6,057,200 A | 5/2000 | Prall et al. |
| 6,058,945 A | 5/2000 | Fujiyama et al. |
| 6,060,397 A | 5/2000 | Seamons et al. |
| 6,069,068 A | 5/2000 | Rathore et al. |
| 6,074,478 A | 6/2000 | Oguro |
| 6,077,775 A | 6/2000 | Stumborg et al. |
| 6,083,818 A | 7/2000 | Stumborg et al. |
| 6,093,368 A | 7/2000 | Rafferty et al. |
| 6,100,184 A | 8/2000 | Zhao et al. |
| 6,139,700 A | 10/2000 | Kang et al. |
| 6,146,517 A | 11/2000 | Hoinkis |
| 6,147,405 A | 11/2000 | Hu |
| 6,153,010 A | 11/2000 | Kiyoku et al. |
| 6,164,295 A | 12/2000 | Ui et al. |
| 6,177,761 B1 | 1/2001 | Pelka et al. |
| 6,181,012 B1 | 1/2001 | Edelstein et al. |
| 6,183,565 B1 | 2/2001 | Granneman et al. |
| 6,184,128 B1 | 2/2001 | Wang et al. |
| 6,188,134 B1 | 2/2001 | Stumborg et al. |
| 6,190,453 B1 | 2/2001 | Boydston et al. |
| 6,190,976 B1 | 2/2001 | Shishiguchi et al. |
| 6,200,893 B1 | 3/2001 | Sneh |
| 6,203,613 B1 | 3/2001 | Gates et al. |
| 6,207,487 B1 | 3/2001 | Kim et al. |
| 6,207,567 B1 | 3/2001 | Wang et al. |
| 6,221,168 B1 | 4/2001 | Carter et al. |
| 6,225,213 B1 | 5/2001 | Urabe |
| 6,225,650 B1 | 5/2001 | Tadatomo et al. |
| 6,235,568 B1 | 5/2001 | Murthy et al. |
| 6,270,572 B1 | 8/2001 | Kim et al. |
| 6,277,735 B1 | 8/2001 | Matsubara |
| 6,287,965 B1 | 9/2001 | Kang et al. |
| 6,291,876 B1 | 9/2001 | Stumborg et al. |
| 6,303,523 B2 | 10/2001 | Cheung et al. |
| 6,316,795 B1 | 11/2001 | Croke, III |
| 6,335,251 B2 | 1/2002 | Miyano et al. |
| 6,340,619 B1 | 1/2002 | Ko |
| 6,342,448 B1 | 1/2002 | Lin et al. |
| 6,343,183 B1 | 1/2002 | Halpin et al. |
| 6,345,150 B1 | 2/2002 | Yoo |
| 6,348,096 B1 | 2/2002 | Sunakawa et al. |
| 6,351,039 B1 | 2/2002 | Jin et al. |
| 6,358,829 B2 | 3/2002 | Yoon et al. |
| 6,365,453 B1 | 4/2002 | DeBoer et al. |
| 6,368,954 B1 | 4/2002 | Lopatin et al. |
| 6,372,584 B1 | 4/2002 | Yu |

(56) References Cited

U.S. PATENT DOCUMENTS

| | | |
|---|---|---|
| 6,376,318 B1 | 4/2002 | Lee et al. |
| 6,380,065 B1 | 4/2002 | Komai et al. |
| 6,391,796 B1 | 5/2002 | Akiyama et al. |
| 6,444,495 B1 | 9/2002 | Leung et al. |
| 6,454,854 B1 | 9/2002 | Ose |
| 6,455,935 B1 | 9/2002 | Hu |
| 6,462,411 B1 | 10/2002 | Watanabe et al. |
| 6,482,733 B2 | 11/2002 | Raaijmakers et al. |
| 6,486,018 B2 | 11/2002 | Roberts et al. |
| 6,524,953 B1 | 2/2003 | Hu |
| 6,555,839 B2 | 4/2003 | Fitzgerald |
| 6,555,845 B2 | 4/2003 | Sunakawa et al. |
| 6,566,279 B2 | 5/2003 | Suemitsu et al. |
| 6,583,015 B2 | 6/2003 | Fitzgerald et al. |
| 6,593,191 B2 | 7/2003 | Fitzgerald |
| 6,593,211 B2 | 7/2003 | Sato |
| 6,614,695 B2 | 9/2003 | Keays |
| 6,657,223 B1 | 12/2003 | Wang et al. |
| 6,716,713 B2 | 4/2004 | Todd |
| 6,727,169 B1 | 4/2004 | Raaijmakers et al. |
| 6,743,721 B2 | 6/2004 | Lur et al. |
| 6,821,825 B2 | 11/2004 | Todd et al. |
| 6,881,633 B2 | 4/2005 | Hakazono |
| 6,900,115 B2 | 5/2005 | Todd |
| 6,958,253 B2 | 10/2005 | Todd |
| 6,962,859 B2 | 11/2005 | Todd et al. |
| 6,969,875 B2 | 11/2005 | Fitzgerald |
| 6,974,730 B2 | 12/2005 | Diaz |
| 6,998,305 B2 | 2/2006 | Arena et al. |
| 7,026,219 B2 | 4/2006 | Pomarede et al. |
| 7,108,748 B2 | 9/2006 | Brabant et al. |
| 7,153,772 B2 | 12/2006 | Granneman et al. |
| 7,186,630 B2 | 3/2007 | Todd |
| 7,312,128 B2 | 12/2007 | Kim et al. |
| 7,335,545 B2 | 2/2008 | Currie |
| 7,405,131 B2 | 7/2008 | Chong et al. |
| 7,732,305 B2 | 6/2010 | Ye et al. |
| 7,759,199 B2 | 7/2010 | Thomas et al. |
| 7,960,256 B2 | 6/2011 | Ye et al. |
| 8,367,528 B2 | 2/2013 | Bauer et al. |
| 2001/0001742 A1 | 5/2001 | Huang et al. |
| 2001/0034123 A1 | 10/2001 | Jeon et al. |
| 2001/0046766 A1 | 11/2001 | Asakawa |
| 2002/0022347 A1 | 2/2002 | Park et al. |
| 2002/0023520 A1 | 2/2002 | Hu |
| 2002/0034864 A1 | 3/2002 | Mizushima et al. |
| 2002/0052124 A1 | 5/2002 | Raaijmakers et al. |
| 2002/0168868 A1 | 11/2002 | Todd |
| 2003/0036268 A1 | 2/2003 | Brabant et al. |
| 2003/0080361 A1 | 5/2003 | Murthy et al. |
| 2003/0082300 A1 | 5/2003 | Todd et al. |
| 2003/0230233 A1 | 12/2003 | Fitzgerald et al. |
| 2004/0171238 A1 | 9/2004 | Arena et al. |
| 2004/0185665 A1 | 9/2004 | Kishimoto et al. |
| 2004/0224089 A1 | 11/2004 | Singh et al. |
| 2004/0262694 A1 | 12/2004 | Chidambaram |
| 2005/0023520 A1 | 2/2005 | Lee et al. |
| 2005/0079692 A1 | 4/2005 | Samoilov et al. |
| 2005/0093021 A1 | 5/2005 | Ouyang et al. |
| 2005/0176220 A1 | 8/2005 | Kanemoto |
| 2005/0250298 A1 | 11/2005 | Bauer |
| 2006/0011984 A1 | 1/2006 | Currie |
| 2006/0014366 A1 | 1/2006 | Currie |
| 2006/0057821 A1 | 3/2006 | Lee et al. |
| 2006/0115933 A1 | 6/2006 | Ye et al. |
| 2006/0115934 A1 | 6/2006 | Kim et al. |
| 2006/0166414 A1 | 7/2006 | Carlson et al. |
| 2006/0166668 A1 | 8/2006 | Samoilov |
| 2006/0169669 A1 | 8/2006 | Zojaji et al. |
| 2006/0205194 A1 | 9/2006 | Bauer |
| 2006/0228842 A1 | 10/2006 | Zhang et al. |
| 2006/0234504 A1 | 10/2006 | Bauer et al. |
| 2006/0289900 A1 | 12/2006 | Thirupapuliyur et al. |
| 2007/0006800 A1 | 1/2007 | Lee et al. |
| 2007/0048956 A1 | 3/2007 | Dip et al. |
| 2007/0287272 A1 | 12/2007 | Bauer et al. |
| 2009/0075029 A1* | 3/2009 | Thomas et al. ............... 428/173 |
| 2009/0075447 A1 | 3/2009 | Meunier-Beillard et al. |
| 2011/0117732 A1* | 5/2011 | Bauer et al. .................. 438/507 |
| 2011/0124169 A1* | 5/2011 | Ye et al. ........................ 438/299 |
| 2011/0230036 A1 | 9/2011 | Ye et al. |

FOREIGN PATENT DOCUMENTS

| | | |
|---|---|---|
| JP | H02-163942 | 12/1988 |
| JP | H04-260325 | 2/1991 |
| JP | H07-022338 | 7/1993 |
| JP | 60-10673 A | 1/1994 |
| JP | 1997-251967 | 9/1997 |
| JP | 1999-514154 | 1/1998 |
| JP | 10256354 | 9/1998 |
| JP | 2001-189451 | 12/1999 |
| JP | 2000-208437 | 7/2000 |
| JP | 2001-284468 | 10/2001 |
| JP | 2005-340816 | 5/2005 |
| JP | 2005-217391 | 8/2005 |
| JP | 2009-538390 | 11/2009 |
| WO | WO 96/17107 | 6/1996 |
| WO | WO 99/41423 | 8/1999 |
| WO | WO 99/62109 | 12/1999 |
| WO | WO 00/11721 | 3/2000 |
| WO | WO 00/13207 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 A3 | 12/2000 |
| WO | WO 00/79576 A1 | 12/2000 |
| WO | WO 01/15220 A1 | 3/2001 |
| WO | WO 01/36702 A1 | 5/2001 |
| WO | WO 01/45149 A1 | 6/2001 |
| WO | WO 01/50502 | 7/2001 |
| WO | WO 01/66832 A3 | 9/2001 |
| WO | WO 01/78123 A1 | 10/2001 |
| WO | WO 01/78124 A1 | 10/2001 |
| WO | WO 01/99166 A1 | 12/2001 |
| WO | WO 2005/043591 | 5/2005 |
| WO | WO 2006/060339 A2 | 6/2006 |
| WO | WO 2008/063543 A2 | 5/2008 |

OTHER PUBLICATIONS

Office Action dated Jan. 23, 2013 for U.S. Appl. No. 13/485,214.

Abeles et al.; *Amorphous Semiconductor Superlattices*; Physical Review Letters; Nov. 21, 1983; pp. 2003-2006; vol. 51; No. 21.

Aoyama et al, "Segregation of interface carbon during silicon epitaxial growth by UHV-CVD", *Journal of Crystal Growth*, 157, pp. 323-326 (1995).

Aoyama et al, "Si selective epitaxial growth using $Cl_2$ pulsed molecular flow method", *Thin Solid Films*, 321, pp. 256-260 (1998).

Bauer et al, "$Si_3H_8$ based epitaxy of biaxially stressed silicon films doped with carbon and arsenic for CMOS applications", in *Semiconductor Defect Engineering—Materials, Synthetic Structures and Devices*, edited by S. Ashok et al, (Mater. Res. Soc. Symp. Proc. 864, Warrendale, PA, 2005), E4.30.

Bauer et al, "Tensile strained selective silicon carbon alloys for recessed source drain areas of devices", Meeting Abstract, *Electrochem. Soc.*, 602, p. 1414 (2006).

Bauer et al., "Time resolved reflectivity measurements of silicon solid phase epitaxial regrowth", Thin Solid Films 364, pp. 228-232 (2000).

Bedair; *Selective area and sidewall growth by atomic layer epitaxy*; Semicond Sci. Technol; 1993; 1052-1062; vol. 8.

Berti et al, "Lattice parameter in $Si_{1-y}C_y$ epilayers: Deviation from Vegard's rule", *Applied Physics Letters*, 72(13), pp. 1602-1604 (Mar. 30, 1998).

Bogumilowicz et al, "Chemical vapour etching of Si, SiGe and Ge with HCl; applications to the formation of thin relaxed SiGe buffers and to the revelation of threading dislocations", *Semicond. Sci. Technol.*, 20, pp. 127-134 (2005).

(56) References Cited

OTHER PUBLICATIONS

Byun, Jeong S., Kwan G. Rha et al., "Epitaxial TiSi2 Growth on Si(100) From Reactive Sputtered TiNx and Subsequent Annealing", Materials Research Soc. Proceedings, vol. 355, Pittsburgh, 1995, pp. 465-470.

Byun, Jeong S, "Epitaxial C49-TiSi2 Formation on (100)Si Substrate Using TiNx and Its Electrical Characteristics as a Shallow Contact Metallization", J. Electrochem. Soc., vol. 143, No. 6, Jun. 1996, pp. 1984-1991.

Byun, Jeong S, Chang Reol Kim et al., "TiN/TiSi2 Formation Using TiNx Layer and Its Feasibilities in ULSI", Jpn. J. Appl. Phys. vol. 35 (1995), pp. 982-986.

Byun, Jeong S, Hak Nam Kim et al., "Formation of a large grain sized TiN layer using TiNx, the epitaxial continuity at the Al/TiN interface . . . ", J. Appl. Phys. 78(3), Aug. 1, 1995, pp. 1719-1724.

Byun, Jeong S, Jun Ki Kim et al., "W as a Bit Line Interconnection in Capacitor-Over-Bit-Line (COB) Structured Dynamic Random Access Memory (DRAM) and Feasible Diffusion Barrier Layer", Jpn. J. Appl. Phys. vol. 35 (1996), pp. 1086-1089.

Celotti et al, "Lattice parameter study of silicon uniformly doped with boron and phosphorus", *Journal of Materials Science*, 9(5), pp. 821-828 (May 1974).

Chowdhury et al. "In-Situ Real-Time Mass Spectroscopic Sensing and Mass Balance Modeling of Selective Area Silicon PECVD", *AIP Conference Proceedings, American Institute of Physics*, vol. 449, Mar. 23, 1998, pp. 363-367.

Develyn et al, "Adsorption, desorption, and decomposition of HCl and HBr on Ge(100)—Competitive pairing and near-first-order desorption-kinetics", *Journal of Chemical Physics*, 101(3), pp. 2463-2475 (1994).

Düscö et al.; *Deposition of Tin Oxide into Porous Silicon by Atomic Layer Epitaxy*; J. Electrochem. Soc.; Feb. 1996; pp. 683-687; vol. 143, No. 2.

Eberl et al., "Structural properties of SiC and SiGeC alloy layers on Si", Chapter 2.5 in "Properties of Silicon Germanium and SiGe:Carbon", Institution of Electrical Engineers, pp. 75-77 (1999).

Fazan et al.; *A High-C Capacitor (20.4 Ff/um2) with Ultrathin CVD—Ta2O5 Films Deposited on Rugged Poly-Si for High Density DRAMs*; IEEE; 1992; pp. IDEM 92-263-IDEM 92-266.

Feng et al., "Raman determination of layer stresses and strains for heterostructures and its application to the cubic SiC/Si system", J. Appl. Phys. 64 (12), pp. 6827-6835 (1988).

George et al.; *Nucleation and Growth During Tungsten Atomic Layer Deposition on Oxide Surfaces*; Mat. Res. Symp. Proc. vol. 672; Materials Research Society 2001; 07.7.1-07.7.7.

Goesele et al, "Diffusion Engineering by Carbon in Silicon", in *Si Front-End Processing Physics and Technology of Dopant-Defect Interactions II*, edited by A. Agarwal et al, (Mater. Res. Soc. Symp. Proc. 610, San Francisco CA, 2000), B7.1.

Hartmann et al, "High C content Si/Si$_{1-y}$C$_y$ heterostructures for n-type metal oxide semiconductor transistors", *Semicond. Sci. Technol.*, 19, pp. 593-601 (2004).

Haukka et al.; *Chemisorption of chromium acetylacetonate on porous high surface area silica*; Applied Surface Science; 1994; pp. 220-227.

Hiltunen et al.; *Nitrides of Titanium, Niobium, Tantalum and Molybdenum Grown as Thin Films by the Atomic Layer Epitaxy Method*; Thin Solid Films; 1988; pp. 149-154; vol. 166.

Horiike et al.; *Filling of Si Oxide into a Deep Trench using Digital CVD Method*; Applied Surface Science; 1990; pp. 168-174; vol. 46.

Hoyt, "Substitutional carbon incorporation and electronic characterization of Si$_{1-y}$C$_y$/Si and Si$_{1-x-y}$Ge$_x$C$_y$/Si heterojunctions", Chapter 3 in *Silicon-Germanium Carbon Alloy*, Taylor and Francis, pp. 59-89 (New York 2002).

International Search Report and Written Opinion of the International Searching Authority for International Application No. PCT/US2007/011464 mailed Mar. 12, 2007.

Iyer et al, "Synthesis of Si$_{1-y}$C$_y$ alloys by molecular beam epitaxy", *Applied Physics Letters*, 60(3), pp. 356-358 (Jan. 20, 1992).

Jin et al.; *Porous Silica Xerogel Processing and Integration for ULSI Applications*; Materials Research Society Symposium Proceedings; 1998; pp. 213-222; vol. 511.

Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).

Juppo et al.; *Deposition of copper films by an alternate supply of CuCl and Zn*; J. Vac. Sci. Technol.; 1997; pp. 2003; vol. issue A 15(4).

Kaizuka et al.; *Conformal Chemical Vapor Deposition TiN(111) Film Formation as an Underlayer of Al for Highly Reliable Interconnects*; Jpn. J. Appl. Phys.; 1994; pp. 470-474; vol. 33.

Kelires, "Monte Carlo studies of ternary semiconductor alloys: application to the Si$_{1-x-y}$Ge$_x$C$_y$ system", *Physical Review B*, 75, pp. 1114-1117 (Aug. 7, 1995).

Kelires, "Short-range order, bulk moduli, and physical trends in c-Si$_{1-x}$C$_x$ alloys", *Physical Review B*, 55, pp. 8784-8787 (Apr. 1, 1997).

Kikkawa et al.; *A Quarter-Micrometer Interconnection Technology Using a TiN/Al-Si-Cu/TiN/Al-Si-Cu/TiN/Ti Multilayer Structure*; IEEE Transactions on Electron Devices; Feb. 1993; pp. 296-302; vol. 40, No. 2.

Kikkawa et al.; *Al-Si-Cu/TiN multilayer interconnection and Al-Ge reflow sputtering technologies for quarter-micron devices*; SPIE; 1992; pp. 54-64; vol. 1805.

Kim et al.; *Applicability of ALE Tin films as Cu/Si diffusion barriers*; Thin Solid Films; 2000; pp. 276-283; 372(1).

Kim et al.; *Comparison of TiN and TiAlN as a Diffusion Barrier Deposited by Atomic Layer Deposition*; Journal of the Korean Physical Society; 2002; pp. 176-179; 40(1).

Kim et al., "Low temperature selective Si epitaxy by reduced pressure chemical vapor deposition introducing periodic deposition and etching cycles with SiH4, H2 and HCl". Mat. Res. Soc. Symp. Proc. vol. 609 © 2000 Materials Research Society. pp. A8.2.1 to A8.2.6.

Klaus et al.; *Atomic Layer Deposition of SiO2 Using Catalyzed and Uncatalyzed Self-Limiting Surface Reactions*; Surface Review and Letters; 1999; pp. 435-448; vol. 6, Nos. 3 & 4.

Klaus et al.; *Atomic Layer Deposition of Tungsten Nitride Films Using Sequential Surface Reactions*; J. Electrochem Soc.; 2000; 1175-1181; 147(3).

Klaus et al.; *Atomically controlled growth of tungsten and tungsten nitride using sequential surface reactions*; Applied Surface Science; 2000; pp. 479-491; vols. 162-163.

Koo et al.; *Study on the characteristics of Ti AlN thin film deposited by atomic layer deposition method*; Journal of Vacuum Science & Technology, A: Vacuum Surfaces, and Films; 2001; 2931-2834; 19(6).

Kouvetakis et al., "Synthesis and analysis of compounds and alloys in the GeC, SiC, and SiGeC systems", Chapter 2 in Series—Optoelectronic properties of semiconductors and superlattices; v. 15 Silicon-germanium carbon alloy / edited by S.T. Pantelides and S. Zollner; pp. 19-58.

Kukli et al.; *Atomic Layer Epitaxy Growth of Tantalum Oxide Thin Films from Ta(OC2H5)5 and H2O*; J. Electrochem. Soc.; May 1995; pp. 1670-1674; vol. 142, No. 5.

Kuznetsov et al., "Continuity in development of ultra shallow junctions for 130-45 nm CMOS: the tool and annealing methods," Abstract 11th IEEE, RTP 2003 Conference, Sep. 23-26, 2003, Charleston, USA.

Lauwers, et al., "Low temperature spike anneal for Ni-silicide formation," Microelectronic Engineering 76, 303-310 (MAM2004, Brussels, Belgium, Mar. 7-10, 2004).

Leskelä et al.; *Atomic Layer Epitaxy in Deposition of Various Oxide and Nitride Thin Films*; Journal De Physique IV, Colloque C5, supplement au Journal de Physique II; Jun. 1995; pp. C5-937-C5-951; vol. 5.

Lin et al, "Chlorine-induced Si surface segregation on the Ge-terminated Si/Ge(100) surface from core-level photoemission", *Physical Review B*, 64, 233302 (2001).

Lin et al, "Atomistics of Ge deposition on Si(100) by atomic layer epitaxy", *Physical Review Letters*, 90(4), 046102 (Jan. 31, 2003).

(56) References Cited

OTHER PUBLICATIONS

Lou, et al., "The Process Window of a-Si/Ti Bilayer Metallization for an Oxidation-Resistant and Self-Aligned TiSi2 Process," IEEE Transactions on Electron Devices, vol. 39, No. 8, Aug. 1992, pp. 1835-1843.
MacKnight et al., "RTP applications and technology options for the sub-45 nm node", Proceedings, RTP2004 Conference (Portland, OR) (2004).
Martens et al., "Study of Ni-Silicide Contacts to Si:C Source/Drain", The Electrochemical Society Meeting, Oct. 30, 2006, Cancun, Mexico.
Martensson et al.; *Atomic layer epitaxy of copper an ab inition investigation of the CuCl/H2 process III. Reaction barriers*; Appl. Surf. Sci.; 2000; 92-100; 157(1).
Martensson et al.; *Atomic Layer Epitaxy of Copper on Tantalum*; Chemical Vapor Deposition; 1997; pp. 45-50; vol. 3, No. 1.
Martensson et al.; *Atomic Layer Epitaxy of Copper, Growth and Selectivity in the Cu(II)-2,2,6, 6-tetramethyl-3,5-heptanedionate/H2 Process*; J. Electrochem. Soc.; Aug. 1998; pp. 2926-2931; vol. 145, No. 8.
Martensson et al.; *CU(THD)2 as Copper Source in Atomic Layer Epitaxy*; Proc. Electrochem. Soc.; 1997; 1529-1536; 97-25.
Martensson et al.; *Use of Atomic Layer Epitaxy for Fabrication of Si/TiN/Cu Structures*; J. Vac. Sci. Technol. B, Sep./Oct. 1999; pp. 2122-2128; vol. 17, No. 5.
McVay et al, "The diffusion of germanium in silicon", *Journal of Applied Physics*, 44(3), pp. 1409-1410 (Mar. 1973).
McVay et al, "Diffusion of Ge in SiGe alloys", *Physical Review B*, 9, 627-631 (Jan. 1974).
Meléndez-Lira et al., "Substitutional carbon in $Si_{1-y}C_y$ alloys as measured with infrared absorption and Raman spectroscopy", J. Appl. Phys. 82, pp. 4246-4252 (1997).
Min et al.; *Atomic Layer Deposition of TiN Films by Alternate Supply of Tetrakis (ethylmethylamino)-Titanium and Ammonia*; Japanese Journal of Applied Physics; 1998; pp. 4999-5004; vol. 37.
Min et al.; *Chemical Vapor Deposition of Ti-Si-N Films with Alternating Source Supply*; Mat. Res. Soc. Symp. Proc.; 1999; pp. 207-210; vol. 564; Materials Research Society.
Min et al.; *Metal-Organic Atomic-Layer Deposition of Titanium-Silicon-Nitride Films*; Applied Physics Letters; 1999; pp. 1521-1523; vol. 75, No. 11.
Min; *Atomic Layer Deposition of TiN Thin Films by Sequential Introduction of Ti Precursor and NH3*; Materials Research Society Symposium Proceedings; 1998; pp. 337-343; vol. 514.
Mitchell et al, "Germanium diffusion in polysilicon emitters of SiGe heterojunction bipolar transistors fabricated by germanium implantation", *Journal of Applied Physics*, 92(11), pp. 6924-6926 (Dec. 1, 2002).
Moller; *Copper and Nickel Ultrathin Films on Metal-Oxide Crystal Surfaces* Mater. Soc. Monogr.; 1994; 473-522; 81.
Nakahata et al, "Low thermal budge surface cleaning after dry etching for selective silicon epitaxial growth", *Journal of Crystal Growth*, 226, pp. 443-450 (2001).
Nakahata et al, "Formation of selective epitaxially grown silicon with a flat edge by ultra-high vacuum chemical vapor deposition", *Journal of Crystal Growth*, 233, pp. 82-87 (2001).
Nakahata et al, "Optimization of process conditions of selective epitaxial growth for elevated source/drain CMOS transistor", *Journal of Crystal Growth*, 243, pp. 87-93 (2002).
Nakahata et al, "Low thermal budget selective epitaxial growth for formation of elevated source/drain MOS transistors", *Journal of Crystal Growth*, 264, pp. 79-85 (2004).
Niinistö et al.; *Synthesis of oxide thin films and overlayers by atomic layer epitaxy for advanced applications*; Materials Science and Engineering; 1996; pp. 23-29; vol. B41.
O'Neil et al., "Optimization of process conditions for selective silicon epitaxy using disilane, hydrogen, and chlorine", J. Electrochem. Soc. 144 (9), pp. 3309-3315 (1997).
Oehme et al., "A novel measurement method of segregating adlayers in MBE", Thin Solid Films 369, pp. 138-142 (2000).

Oehme et al, "Carbon segregation in silicon", *Thin Solid Films*, 380(1-2), pp. 75-77 (Dec. 22, 2000).
Osten et al, "Substitutional versus interstitial carbon incorporation during pseudomorphic growth of $Si_{1-y}C_y$ on Si(001)", *Journal of Applied Physics*, 80(12), pp. 6711-6715 (Dec. 15, 1996).
Osten et al, "Substitutional carbon incorporation in epitaxial $Si_{1-y}C_y$ alloys on Si(001) grown by molecular beam epitaxy", *Applied Physics Letters*, 74(6), pp. 836-838 (Feb. 8, 1999).
Ott et al.; *Modification of Porous Alumina membranes Using Al2O3 Atomic Layer Controlled Deposition*; Chem. Mater.; 1997; pp. 707-714; vol. 9.
Pages, et al., "The effect of ramp rate—short process time and partial reactions on cobalt and nickel silicide formation," Proceedings 205th ECS Meeting, May 9-13, 2004, San Antonio TX, USA, p. 174-182.
PCT Search Report, PCT Application PCT/US2006/003333; Jun. 30, 2006.
PCT Search Report, PCT Application PCT/US2006/003465; Jul. 7, 2006.
Ritala et al.; *Atomic Layer Epitaxy Growth of TiN Thin Films from Tila and NH3*; J. Electrochem. Soc.; Aug. 1998; pp. 2914-2920; vol. 145; No. 8.
Ritala et al.; *Controlled Growth of TaN, Ta3N5, and TaOxNy Thin Films by Atomic Layer Deposition*; Chem. Mater.; 1999; pp. 1712-1718; vol. 11.
Ritala et al.; *Effects of intermediate zinc pulses on properties of TiN and NbN films deposited by atomic layer epitaxy*; Appl. Surf. Sci.; 1997; 199-212; 120.
Ritala et al.; *Perfectly Conformal TiN and Al2O3 Films Deposited by Atomic Layer Deposition*; Chem Vap. Deposition; 1999; pp. 7-9; vol. 5, No. 1.
Rossnagel et al.; *Plasma-enhanced atomic layer deposition of Ta and Ti for interconnect diffusin barriers*; J. Vac. Sci. Technol.; 2000; 2016-2020; 18(4).
Ryan et al.; *Material Property Characterization and Integration Issues for Mesoporous Silica*; IEEE, 1999, pp. IITC 99-187-IITC 99-189.
Sakurai et al, "Adsorption, diffusion and desorption of Cl atoms on Si(111) surfaces", *Journal of Crystal Growth*, 237-239, pp. 212-216 (2002).
Sakaue et al.; *Digital Chemical Vapor Deposition of SiO2 Using a Repetitive Reaction of Triethylsilane/Hydrogen and Oxidation*; Japanese Journal of Applied Physics; Jan. 1990; pp. L124-L127; vol. 30, No. 1B.
Singer; *Atomic Layer Deposition Targets Thin Films*; Semiconductor International; Sep. 1999; pp. 40.
Smith et al., "Plasma Enhanced Selective Area Micocrystalline Silicon Deposition on Hydrogenated Amorphous Silicon: Surface Modification for Controlled Nucleation", *Journal of Vacuum Science and Technology*, American Institute of Physics, vol. 16, No. 3, May 1998, pp. 1316-1320.
Sneh et al.; *Atomic layer growth of SiO2 on Si(100) using SiCl4 and H2O in a binary reaction sequence*; Surface Science; 1995; pp. 135-152; vol. 334.
Solanki et al.; *Atomic Layer Deposition of Copper Seed Layers*; Electrochem. and Solid State Lett.; 2000; 479-480; 3(10).
Soman et al, "Selective area chemical vapor deposition of $Si_{1-x}Ge_x$ thin film alloys by the alternating cyclic method: Experimental data: II. Morphology and composition as a function of deposition parameters", *Journal of the Electrochemical Society*, 147(5), pp. 1854-1858 (May 2000).
Soman et al, "Selective area chemical vapor deposition of $Si_{1-x}Ge_x$ thin film alloys by the alternating cyclic method: A thermodynamic analysis: II. The system Si-Ge-Cl-H-Ar", *Journal of the Electrochemical Society*, 147(11), pp. 4342-4344 (Nov. 2000).
Strane et al., "Carbon incorporation into Si at high concentrations by ion implantation and solid phase epitaxy", J. Appl. Phys. 79 (2), pp. 637-646 (1996).
Strane et al., "Precipitation and relaxation in strained Si1-yCy/Si heterostructures", J. Appl. Phys. 76 (6), pp. 3656-3668 (1994).
Tiitta et al.; *Preparation and Characterization of Phosphorus-Doped Aluminum Oxide Thin Films*; Materials Research Bulletin; 1998; pp. 1315-1323; vol. 33, No. 9.

(56) References Cited

OTHER PUBLICATIONS

U.S. Department of Commerce National Technical Information Service; *Ceramic Coatings on Metals Using Atomic Layer Controlled Chemical Vapor Deposition* (Assert-96); Feb. 16, 2000; Colorado University at Boulder.
Utriainen et al.; *Studies of metallic thin film growth in an atomic layer epitaxy reactor using M(ACAC)2 (M=Ni,Cu,Pt) precursors*; Appl. Surf. Sci.; 2000; 151-158; 157(3).
Van Houtum, H. et al., "TiSi2 strap formation by Ti-amorphous-Si reaction," J. Vac. Sci. Technol. B 6(6), Nov./Dec. 1988, pp. 1734-1739.
Van Zant, "Microchip Fabrication", 4th Ed., McGraw Hill (New York, NY), pp. 364-365 (2000).
Violette et al., "On the role of chlorine in selective silicon epitaxy by chemical vapor deposition", J. Electrochem. Soc. 143 (10), pp. 3290-3296 (1996).
Wang; *Spin on Dielectric Films—A General Overview*; 1998 5th International Conference on Solid-State and Integrated Circuit Technology Proceedings; Oct. 21-23, 1998; p. 961; Beijing, China.
Windl et al., "Theory of strain and electronic structure of $Si_{1-y}C_y$ and $Si_{1-x-y}Ge_xC_y$ alloys", Phys. Rev. B57 (4), pp. 2431-2442 (1998).
Wise et al.; *Diethyldiethoxysilane as a New Precursor for SiO2 Growth on Silicon*; Mat. Res. Soc. Symp. Proc.; 1994; pp. 37-43; vol. 334.
Wolansky et al, "Low temperature clean for Si/SiGe epitaxy for CMOS integration of heterojunction bipolar transistors", *Proceedings of the 8th International Symposium on Silicon Materials Science and Technology 1*, pp. 812-821 (1998).
Wolf et al.; *Process and Equipment Simulation of Copper Chemical Vapor Deposition Using Cu(hfac)vtms*; Microelectronic Engineering; 1999; 15-27; 45.
Wolf et al, "Silicon processing for the VLSI era vol. 1: Process technology", Lattice Press, pp. 140-142 and 155-156 (Sunset Beach, CA 1986).
Wolf et al, "Silicon epitaxial growth and silicon on insulator", Chapter 7 in *Silicon Processing for the VLSI Era*, vol. 1: *Process technology*, 2nd Ed., pp. 225-264 (2000).
Wu et al, "Thermal reactions on the C1-termination SiGe(100) surface", *Surface Science*, 507-510, pp. 295-299 (2002).
Wu et al, "Stability and mechanism of selective etching of ultrathin Ge films on the Si(100) surface upon chlorine adsorption", *Physical Review B*, 69, 045308 (2004).
Yagi et al.; *Substitutional C incorporation into Si1-yCy alloys using novel carbon source, 1,3-disilabutane*; Japanese Journal of Applied Physics; 2004; pp. 4153-4154; vol. 43, No. 7A.
Yamamoto et al, "Chemical vapor phase etching of polycrystalline selective to epitaxial Si and SiGe", *Thin Solid Films* 508, pp. 297-300 (2006).

Zhu, "Modeling of germanium and antimony diffusion in $Si_{1-x}Ge_x$", *Electrochemical Society Proceedings*, Jul. 2004, pp. 923-934 (2004).
Aldao, et al., Halogen etching of Si via atomic-scale processes, Progress in Surface Science, 2001, pp. 189-230, vol. 68.
Aldao, et al., Atomic processes during Cl supersaturation etching of Si(100)-(2×1), Physical Review, 2009, 125303, vol. 79.
Agrawal, et al, Cl Insertion on Si (100)-(2×1): Etching Under Conditions of Supersaturation, Mar. 30, 2007, 136104, PRL 98.
Aketagawa, et al, The influence of $Cl_2$ on $Si_{1-x}Ge_x$ selective epitaxial growth and B doping properties by UHV-CVD, Journal of Crystal Growth, 1993, pp. 484-488, vol. 127.
Aketagawa, et al., Limitations of selective growth conditions in gas-source MBE using $Si_2H_6$, Journal of Crystal Growth, 1991, pp. 860-863, vol. 111.
Antonell, et al., Carbon incorporated for strain compensation during solid phase epitaxial recrystallization of SiGe on Si at 500-600 ° C., J. Appl. Phys., May 15, 1996, vol. 79, No. 10.
Bauer, et al, Low temperature selective epitaxial growth of SiCP on Si(110) oriented surfaces, Thin Solid Films, 2012, pp. 3144-3148, vol. 520.
Bauer, et al., Lower temperature catalyst enhanced etch process with high etch rate selectivity for amorphous silicon based alloys over single-crystalline silicon based alloys, Thin Solid Films, 2012, pp. 3139-3143, vol. 520.
Bauer, et al., Low Temperature Si:C co-flow and hybrid process using $Si_3H_8/Cl_2$, Thin Solid Films, 2012, pp. 3133-3138, vol. 520.
File History for U.S. Appl. No. 12/149,865, filed May 31, 2011.
Gao, et al, Comparison of Cl2 and HCl adsorption on Si(100)-(2×1), Thin Solid Films, 1993, pp. 140-144, vol. 225.
Gao, et al., Influence of phosphine flow rate on Si growth rate in gas source molecular beam epitaxy, Journal of Crystal Growth, 2000, pp. 461-465, vol. 220.
Maruno, et al., Selective Epitaxial Growth by Ultrahigh-Vacuum Chemical Vapor Deposition with Alternating Gas Supply of $Si_2H_6$ and $Cl_2$, Jpn. J. Appl. Phys., Nov. 2000, pp. 6139-6142, vol. 39.
Office Action dated Feb. 12, 2013, received in Japanese Patent Application 2009-514271, with English translation.
Ogryzlo, et al., Doping and crystallographic effects in Cl-atom etching of silicon, J. Appl. Phys., Mar. 15, 1990, pp. 3115-3120, vol. 67, No. 6.
Ogryzlo, et al., The etching of doped polycrystalline silicon by molecular chlorine, J. Appl. Phys., Dec. 1, 1988, pp. 6510-6514, vol. 64, No. 11.
Preliminary Notice of First Office Action dated Jan. 22, 2013 for R.O.C Patent application 96118850.
Tatsumi, et al., Selective epitaxial growth by UHV-CVD using $Si_2H_6$ and $Cl_2$, Journal of Crystal Growth, 1992, pp. 275-278, vol. 120.
Violette, et al., Low temperature selective silicon epitaxy by ultra high vacuum rapid thermal chemical vapor deposition using $Si_2H_6$, $H_2$ and $Cl_2$, Appl. Phys., Jan. 1, 1996, pp. 66-68, No. 1, vol. 68.

* cited by examiner

HIGH THROUGHPUT CYCLICAL EPITAXIAL DEPOSITION AND ETCH PROCESS

CROSS-REFERENCE TO RELATED APPLICATIONS

This application is related to U.S. patent application Ser. No. 11/536,463 (filed Sep. 28, 2006 and published as U.S. 2007/0287272).

BACKGROUND OF THE INVENTION

1. Field of the Invention

This application relates to methods of epitaxial deposition of silicon-containing materials. More specifically, the present application relates to methods of cyclical epitaxial deposition and etch.

2. Description of the Related Art

Semiconductor processing is typically used in the fabrication of integrated circuits, which entails particularly stringent quality demands, as well as in a variety of other fields. In forming integrated circuits, epitaxial layers are often desired in selected locations, such as active area mesas among field isolation regions, or even more particularly over defined source and drain regions. While non-epitaxial (amorphous or polycrystalline) material can be selectively removed from over the field isolation regions after a "blanket" deposition, it is typically considered more efficient to simultaneously provide chemical vapor deposition (CVD) and etching chemicals, and to tune conditions to result in zero net deposition over insulative regions and net epitaxial deposition over exposed semiconductor windows. This process, known as "selective" epitaxial deposition, takes advantage of slow nucleation of typical semiconductor deposition processes on insulators like silicon oxide or silicon nitride. Such selective epitaxial deposition also takes advantage of the naturally greater susceptibility of amorphous and polycrystalline materials to etchants, as compared to the susceptibility of epitaxial layers to the same etchants.

The selective formation of epitaxial layers typically involves the use of silicon-containing precursors and etchants along with a carrier gas. One of the most commonly used carrier gases is hydrogen gas ($H_2$). Hydrogen is a useful carrier gas because it can be provided in very high purity and is compatible with silicon deposition. Additionally, it can serve as a reducing agent to form $H_2O$ and remove any contaminant oxygen from the substrate or chamber generally. Accordingly, hydrogen remains one of the most widely used carrier gases on its own or in combination with other carrier gases.

One desirable attribute of deposited semiconductor material is the "strain" in the material. The electrical properties of semiconductor materials such as silicon, germanium and silicon germanium alloys are influenced by the degree to which the materials are strained. For example, silicon exhibits enhanced electron mobility under tensile strain, and silicon germanium exhibits enhanced hole mobility under compressive strain. Methods of enhancing the performance of semiconductor materials are of considerable interest and have potential applications in a variety of semiconductor processing applications.

A number of approaches for inducing strain in silicon- and germanium-containing materials have focused on exploiting the differences in the lattice constants between various crystalline materials. For example, the lattice constant for crystalline germanium is 5.65 Å, for crystalline silicon is 5.431 Å, and for diamond carbon is 3.567 Å. Heteroepitaxy involves depositing thin layers of a particular crystalline material onto a different crystalline material in such a way that the deposited layer adopts the lattice constant of the underlying single crystal material. For example, using this approach allows for strained silicon germanium layers to be formed by heteroepitaxial deposition onto single crystal silicon substrates. Since the germanium atoms are slightly larger than the silicon atoms, and the deposited heteroepitaxial silicon germanium is constrained to the smaller lattice constant of the silicon beneath it, the silicon germanium is compressively strained to a degree that varies as a function of the germanium content. Typically, the band gap for the silicon germanium layer decreases monotonically from 1.12 eV for pure silicon to 0.67 eV for pure germanium as the germanium content in heteroepitaxial silicon germanium increases. In another approach, tensile strain can be provided in a thin single crystalline silicon layer by heteroepitaxially depositing the silicon layer onto a relaxed silicon germanium layer. In this example, the heteroepitaxially deposited silicon is strained because its lattice constant is constrained to the larger lattice constant of the relaxed silicon germanium beneath it. The tensile strained heteroepitaxial silicon typically exhibits increased electron mobility. In this approach, the strain is generally developed at the substrate level before the device (for example, a transistor) is fabricated.

In these examples, strain is introduced into single crystalline silicon-containing materials by replacing silicon atoms with other atoms in the lattice structure. This technique is typically referred to as substitutional doping. For example, substitution of germanium atoms for some of the silicon atoms in the lattice structure of single crystalline silicon produces a compressive strain in the resulting substitutionally doped single crystalline silicon material because the germanium atoms are larger than the silicon atoms that they replace. It is possible to introduce a tensile strain into single crystalline silicon by substitutional doping with carbon, because carbon atoms are smaller than the silicon atoms that they replace. Unlike substitutional impurities, non-substitutional impurities will not induce strain.

SUMMARY OF THE INVENTION

It is thus an object of the present application to provide methods of selective deposition.

In one embodiment, a method for selectively forming silicon-containing material over single crystal semiconductor surfaces is provided. A substrate including insulated surfaces and single-crystal semiconductor surfaces is provided. Silicon-containing material can be deposited over the insulating surfaces and single-crystal semiconductor surfaces by flowing a silicon-containing source vapor and an inert carrier gas without flowing $H_2$. Silicon-containing material can be selectively removed from over the insulating surfaces by flowing an etchant while maintaining continuous flow of the inert carrier gas without flowing $H_2$. The deposition and selective removal of silicon-containing material forms a cycle that can be repeated two or more times until a desired thickness of silicon-containing material is achieved.

In one embodiment, a method for selectively forming silicon-containing material in a recess is provided. A substrate including a recess and an adjacent insulating surface is provided into a chemical vapor deposition chamber. Epitaxial material is deposited over the recess and non-epitaxial material is deposited over the adjacent insulating surfaces by flowing trisilane and an inert carrier gas at a constant flow rate. Portions of the non-epitaxial material are selectively removed over the insulating surfaces by flowing an etchant while maintaining a continuous flow of the inert carrier gas. The deposition and selective removal processes form a cycle that can be repeated until a desired thickness of silicon-containing material is deposited in the recess.

In one embodiment, a method for selectively forming carbon-doped silicon-containing material in a recess is provided. A substrate comprising a recess adjacent to an insulator is provided into a chemical vapor deposition chamber. A silicon-containing source vapor, carbon-containing source vapor and an inert carrier gas are introduced to deposit carbon-doped silicon-containing material on the recess and the insulator, wherein the inert carrier gas is introduced at a first flow rate. The flow of silicon-containing source vapor and carbon-containing source vapor can be stopped while reducing the flow rate of the inert carrier gas. While maintaining the inert carrier gas at the reduced flow rate, an etchant can be provided to etch material from the insulator. The deposition and etching processes form a cycle that can be repeated until a desired thickness of material is achieved in the recess.

In one embodiment, a semiconductor substrate having a recess and an adjacent insulating surface is provided into a chemical vapor deposition chamber. A silicon-containing source vapor and an inert carrier gas can be flowed into the chamber to deposit silicon-containing material over the recess and adjacent insulating surfaces. Portions of the silicon-containing material can be selectively removed from over the insulating surfaces by flowing HCl and $GeH_4$ with the inert carrier gas without flowing $H_2$. The deposition and selective removal processes form a cycle that can be repeated until a desired thickness of silicon-containing material is deposited in the recess.

DETAILED DESCRIPTION OF THE EMBODIMENTS

Figure 1:
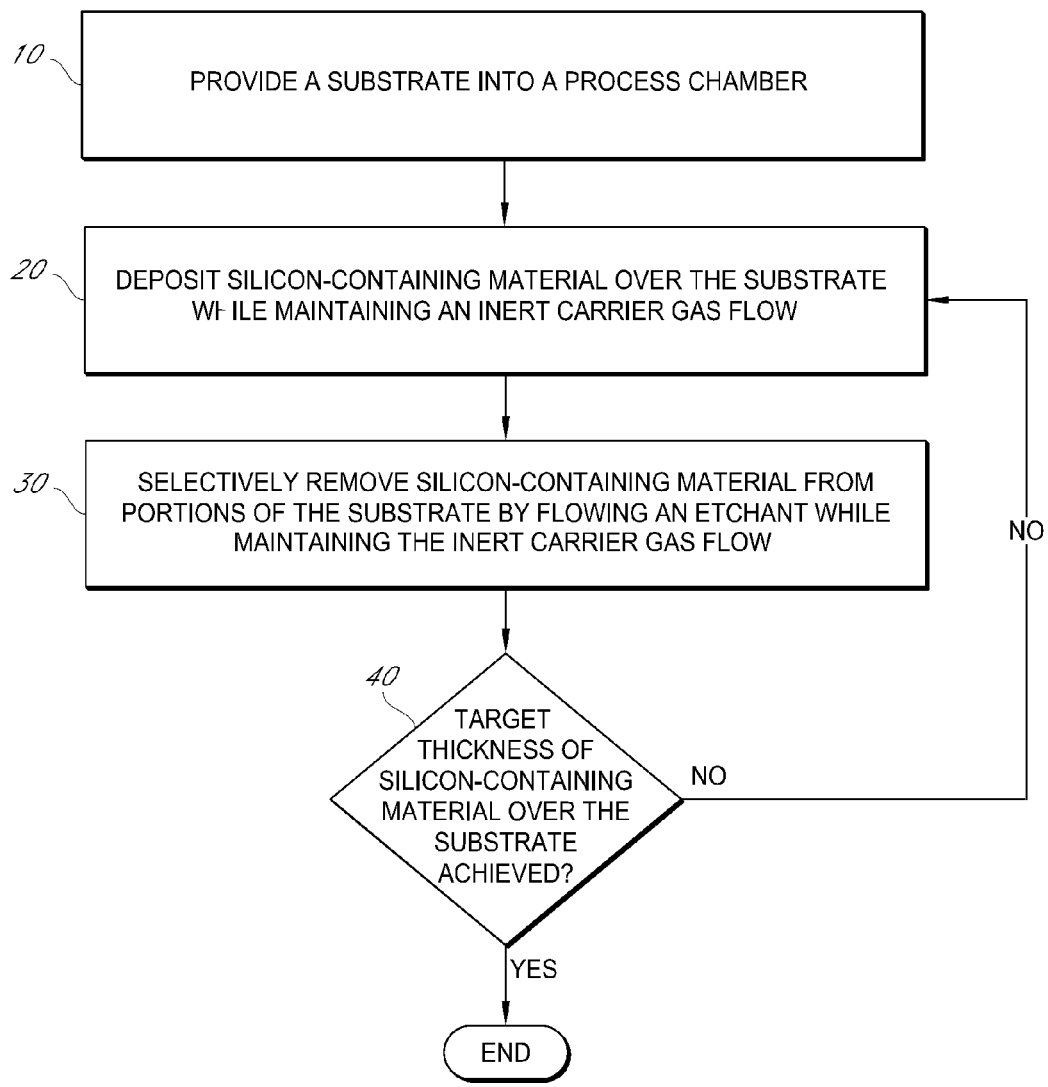
FIG. 1 is a flow chart illustrating a selective epitaxial formation process according to one embodiment of the present application.

Methods are provided for an improved selective process using a deposition and etch back process cyclically. In some embodiments, during deposition, a silicon-source precursor is used to deposit material over a semiconductor structure. The deposition is followed by an etch process to remove material from areas of the semiconductor structure. An inert carrier gas is used during the deposition process, the etch process or both.

In addition to using an inert carrier gas, hydrogen gas ($H_2$) can also be used as a carrier gas in some embodiments. It has been found, however, that while using hydrogen gas provides numerous benefits, hydrogen gas also presents some difficulties. For example, during deposition at low temperatures, hydrogen can inhibit efficient decomposition and surface adsorption of precursors due to hydrogen termination, resulting in a reduced deposition rate and ultimately, reduced throughput. Additionally, in order to achieve both a uniform film deposition and a reasonable etch rate, Applicants have found that hydrogen carrier gas flow should be reduced during certain etch processes, particularly etch processes using HCl. In some embodiments, hydrogen carrier gas flow should be completely absent from the etch processes, and in fact, completely absent from the entire selective formation process using a deposition and etch cycle, particularly where the etch employs $Cl_2$.

In some embodiments, the deposition process is blanket, while in other embodiments, the deposition process is selective. In a selective deposition, a silicon-source precursor is used with an etchant to deposit material over a semiconductor structure. In some embodiments, a small amount of etching chemicals may be provided during the deposition process such that the deposition can be considered "partially selective," but nevertheless blanket, since each deposition can still have some net deposition over isolation regions. Accordingly, addition of an etchant with the silicon-source precursor results in deposition that is completely selective or partially selective. The selective deposition is followed by an etch process to remove deposited material from areas of the semiconductor structure. An inert carrier gas is used during the selective deposition process, the etch process or both. In some embodiments, hydrogen gas is absent from at least some periods of the cycle (e.g., during the selective deposition and etch phases). In a preferred embodiment, hydrogen gas is completely absent from the entire selective process using a selective deposition and etch cycle.

Methods of selective epitaxial formation are described that are useful for depositing a variety of substitutionally doped silicon-containing materials. According to embodiments of the present application, silicon-containing material doped with substitutional carbon can be deposited. In some embodiments, the carbon-doped silicon-containing material will be deposited by performing a blanket deposition phase at a relatively high rate using trisilane ($Si_3H_8$) or another silicon source and a carbon-containing gas or vapor as a carbon source, alternated with an etch phase that selectively removes non-epitaxial or highly defective epitaxial semiconductor deposits. In other embodiments, the deposition phase may be selective or partially selective. The degree of substitutional C doping as-deposited can be between about 70% to 90% or greater, expressed as the weight percentage of substitutional carbon dopant based on the total amount of carbon dopant (substitutional and non-substitutional) in the silicon. While described embodiments can include specific examples of carbon-doped silicon, the skilled artisan will appreciate that the methods described herein have application to a variety of semiconductor applications where selective formation of a layer is desired.

The term "silicon-containing material" and similar terms are used herein to refer to a broad variety of silicon-containing materials including without limitation silicon (including crystalline silicon), carbon-doped silicon (Si:C), silicon germanium, carbon-doped silicon germanium (SiGe:C), and silicon tin (SiSn) or silicon germanium tin (SiGeSn). As used herein, "carbon-doped silicon", "Si:C", "silicon germanium", "carbon-doped silicon germanium", "SiGe:C" and similar terms refer to materials that contain the indicated chemical elements in various proportions and, optionally, minor amounts of other elements. For example, "silicon germanium" is a material that comprises silicon, germanium and, optionally, other elements, for example, dopants such as carbon and electrically active dopants. Terms such as "Si:C" and "SiGe:C" are not stoichiometric chemical formulas per se and thus are not limited to materials that contain particular ratios of the indicated elements. Furthermore, terms such as Si:C and SiGe:C are not intended to exclude the presence of other dopants (e.g., P, As or B), and carbon-doped silicon material is included within the term Si:C and the term Si:C:P. The percentage of a dopant (such as carbon, germanium or electrically active dopant) in a silicon-containing film is expressed herein in atomic percent on a whole film basis, unless otherwise stated.

It is possible to determine the amount of carbon substitutionally doped into a silicon-containing material by measuring the perpendicular lattice spacing of the doped silicon-containing material by x-ray diffraction, then applying Vegard's Law by performing a linear interpolation between single crystal silicon and single crystal carbon (diamond), or by applying Kelieres/Berti process. For example, it is possible to determine the amount of carbon substitutionally doped into silicon by measuring the perpendicular lattice spacing of the doped silicon by x-ray diffraction, and then applying Vegard's law. It is possible to determine the total carbon content in the doped silicon by secondary ion mass spectrometry ("SIMS"). Alternatively, application of the Kelieres/Berti relationship tends to calculate lower levels (e.g., 3.8% C as measured by Vegard's Law is approximately equivalent to 2.6% C measured using the Kelieres/Berti relationship). It is possible to determine the non-substitutional carbon content by subtracting the substitutional carbon content from the total carbon content. It is possible to determine the amount of other elements substitutionally doped into other silicon-containing materials in a similar manner. In some embodiments, the crystal phase may be determined by x-ray diffraction and the stoichiometry by Rutherford backscattering spectroscopy (RBS). In a preferred embodiment, Raman and FT-IR spectroscopy is used to determine the amount of carbon substitutionally doped in a silicon-containing material.

"Substrate," as that term is used herein, refers either to the workpiece upon which deposition is desired, or the surface exposed to one or more deposition gases. For example, in certain embodiments the substrate is a single crystal silicon wafer, a semiconductor-on-insulator ("SOI") substrate, or an epitaxial silicon surface, a silicon germanium surface, or a III-V material deposited upon a wafer. Workpieces are not limited to wafers, but also include glass, plastic, or other substrates employed in semiconductor processing. A "mixed substrate" is a substrate that has two or more different types of surfaces. For example, in certain applications a mixed substrate comprises a first surface having a first surface morphology and a second surface having a second surface morphology. In certain embodiments, carbon-doped silicon-containing layers are selectively formed over single crystal semiconductor materials while minimizing, and more preferably avoiding, deposition over adjacent dielectrics or insulators. Examples of dielectric materials include silicon dioxide (including low dielectric constant forms such as carbon-doped and fluorine-doped oxides of silicon), silicon nitride, metal oxide and metal silicate. The terms "epitaxial," "epitaxially," "heteroepitaxial," "heteroepitaxially" and similar terms are used herein to refer to the deposition of a crystalline silicon-containing material onto a crystalline substrate in such a way that the deposited layer adopts or follows the lattice constant of the substrate, at least until a critical thickness of a heteroepitaxial layer is reached. Epitaxial deposition is generally considered to be heteroepitaxial when the composition of the deposited layer is different from that of the substrate.

Even if surfaces are made from the same elements, the surfaces are considered different if the morphologies (crystallinity) of the surfaces are different. The processes described herein are useful for depositing silicon-containing films on a variety of substrates, but are particularly useful for mixed substrates having mixed surface morphologies. Such a mixed substrate comprises a first surface having a first surface morphology and a second surface having a second surface morphology. In this context, "surface morphology" refers to the crystalline structure of the substrate surface. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by a crystal structure and orientation that is identical to the substrate upon which they are grown, typically single crystal. The atoms in these materials are arranged in a lattice-like structure that persists over relatively long distances (on an atomic scale). Amorphous morphology is a non-crystalline structure having a low degree of order because the atoms lack a definite periodic arrangement. Other morphologies include microcrystalline and mixtures of amorphous and crystalline material. "Non-epitaxial" thus encompasses amorphous, polycrystalline, microcrystalline and mixtures of the same. As used herein, "single-crystal" or "epitaxial" are used to describe a predominantly large crystal structure having a tolerable number of faults therein, as is commonly employed for transistor fabrication. The crystallinity of a layer generally falls along a continuum from amorphous to polycrystalline to single-crystal; a crystal structure is often considered single-crystal or epitaxial, despite low density faults. Specific examples of mixed substrates include without limitation single crystal/polycrystalline, single crystal/amorphous, epitaxial/polycrystalline, epitaxial/amorphous, single crystal/dielectric, epitaxial/dielectric, conductor/dielectric, and semiconductor/dielectric. The term "mixed substrate" includes substrates having more than two different types of surfaces. Methods described herein for depositing silicon-containing films onto mixed substrates having two types of surfaces are also applicable to mixed substrates having three or more different types of surfaces.

Improved methods of selective epitaxial formation using a cyclical deposition and etch back are now described. The deposition and etch back processes form a cycle which can be repeated to achieve a desired thickness of deposited material over portions of a semiconductor substrate. An inert carrier gas, such as nitrogen ($N_2$) or helium (He), can flow during the deposition process, the etch process, or both. In other embodiments, the inert carrier gas will flow continuously between deposition and etch processes. In embodiments in which the inert carrier gas flows continuously between deposition and etch processes, the inert carrier gas flow rate can be constant (e.g., at 10 slm during both the deposition and etch processes), ramped down between deposition and etch processes (particularly those involving HCl) or ramped up between deposition and etch processes (particularly those involving $Cl_2$). For example, in some embodiments involving an HCl etchant, the continuous inert carrier gas flow can have rates that are ramped down between deposition and etch processes (e.g., at 10 slm during deposition ramped down to 1 slm) such that the inert carrier gas flow rate will vary. In some embodiments, the flow rate of an inert carrier gas can vary from a first flow rate of 5-20 slm during deposition to a second flow rate of 1-3 slm during etch. In other embodiments, the flow rate of an inert carrier gas can vary by between 20% and 90% from deposition to etch. Despite the cost (e.g., particles from pressure fluctuation, time for stabilizing flow, wear on valves, etc.) of such inert gas fluctuations, reducing the inert carrier gas flow rate during the etch process can be worthwhile for its strong influence on achieving a high etch rate during the etch phases, without diluting precursors during deposition. While not bound by theory, it is also believed that varying the inert carrier gas flow rate between deposition and etch processes will provide other benefits, such as reducing the likelihood of over-etching in some instances. For example, as noted above, while it is suitable to ramp down the inert gas flow rate during an etch process using HCl, it is preferred not to reduce but rather to ramp up the inert gas flow rate during an etch process using $Cl_2$ to provide a shorter residence time for $Cl_2$, which is more reactive than HCl and more likely to result in undesirable overetching.

FIG. 1 is a flow chart of a selective epitaxial formation process according to one embodiment of the present application. The flow chart illustrates the steps of providing 10 a substrate into a processing chamber, depositing 20 a silicon-containing material over the substrate by flowing a silicon-containing source vapor and an inert carrier gas, selectively removing 30 silicon-containing material from portions of the substrate by flowing an etchant while maintaining the inert carrier gas flow, and repeating the deposition and selective removal phases 20, 30 until a target thickness of silicon-containing material is achieved over the substrate 40.

In accordance with operational block 10, a substrate is provided into a process chamber. The substrate can have a single type of surface, or can have a "mixed" surface having two or more types of surfaces (e.g., insulating surfaces and single crystal semiconductor surfaces). In some embodiments, the substrate that is provided includes one or more recesses. These recesses can form transistor device active source and drain regions that are adjacent to a channel region and can benefit from the deposition of strained material therein.

In accordance with operational block 20, silicon-containing material is deposited over the substrate by flowing a silicon-containing source vapor and an inert carrier gas. The silicon-containing source vapor can comprise one or more of silane ($SiH_4$), dichlorosilane or DCS ($SiCl_2H_2$), among other silicon precursors. In a preferred embodiment, the silicon-containing source comprises trisilane ($Si_3H_8$). The silicon-containing source vapor can be introduced into a chamber for a period to produce a deposition of silicon-containing material over the entire substrate surface. During the deposition process, the silicon-containing source vapor will flow and deposit silicon-containing material. The thickness of material that is deposited can depend on a number of factors, including the composition of the underlying substrate, the type of source vapor used, chamber conditions and the duration of the deposition. The period represented by reference numeral 20 in which a silicon-containing source vapor and an inert carrier gas are introduced is herein referred to as a "deposition phase."

In accordance with the illustrated embodiment, the silicon-containing source vapor is introduced with an inert carrier gas. While hydrogen is typically used as a carrier gas in selective deposition processes due to its compatibility with silicon processes, as shown in U.S. application Ser. No. 11/536,463 to Bauer et al., filed Sep. 28, 2006, it has been discovered that there are benefits to removing hydrogen as a carrier gas during the deposition process. In a preferred embodiment, an inert carrier gas flows without hydrogen during deposition. As described herein, the term "without hydrogen" can refer to no hydrogen or a functionally insignificant amount of hydrogen that does not affect the overall process. The inert carrier gas can be selected from one of the following gases, including krypton (Kr), xenon (Xe) or argon (Ar), with the preferred inert carrier gas being either helium (He) or nitrogen ($N_2$). Among these, nitrogen is more desirable over helium due to relative costs. While in some embodiments the inert carrier gas has a flow rate that varies during the deposition, in other embodiments, the inert carrier gas will remain constant. Applicants have found that using a silicon-containing source without hydrogen can provide a faster deposition (e.g., greater than 100 nm/min) and uniform film deposition than conventional processes, whereas with hydrogen there are trade-offs for the deposition and etch phases. In some embodiments, the rate of deposition of silicon-containing material can be between 1 nm/cycle and 3 nm/cycle, while the thickness non-uniformity can be less than or equal to 1-2%. The deposited silicon-containing material can be used in many different devices, as the number of defects is low enough to permit commercial use of the epitaxial layers.

In addition to the silicon-containing source vapor and inert carrier gas, other precursors can also be provided during the deposition process. In some embodiments, a carbon-source gas comprising a silylalkane such as monosilylmethane, disilylmethane, trisilylmethane, tetrasilylmethane and/or alkylsilane such as monomethyl silane (MMS) and dimethyl silane can be introduced with the silicon-source containing vapor and inert carrier gas, resulting in deposition of a carbon-doped silicon-containing material. By applying various precursors under different conditions, the deposited silicon-containing material can possess different properties. In some embodiments, the deposited silicon-containing material can be a strained heteroepitaxial film that has a lattice structure that differs from an underlying layer.

In some embodiments, a dopant source can be introduced in situ during the deposition phase to incorporate electrically active dopants into the silicon-containing films by chemical vapor deposition. Typical n-type dopant sources include arsenic vapor and dopant hydrides, such as phosphine ($PH_3$) and arsine ($ArH_3$). Silylphosphines, for example $(H_3Si)_{3-x}PR_x$, and silylarsines, for example, $(H_3Si)_{3-x}AsR_x$, where x=0, 1 or 2 and $R_x$=H and/or deuterium (D), are alternative precursors for phosphorous and arsenic dopants. Phosphorous and arsenic are particularly useful for doping source and drain areas of NMOS devices. Such dopant precursors are useful for the preparation of films as described below, preferably phosphorous-, antimony-, indium-, and arsenic-doped silicon, Si:C and SiGe:C films and alloys. Suitable p-type dopant precursors include diborane ($B_2H_6$) and boron trichloride ($BCl_3$) for boron doping. Other p-type dopants for Si include Al, Ga, In, and any metal to the left of Si in the Mendeleev table of elements. Such dopant precursors are useful for the preparation of films as described below, preferably boron-doped silicon, SiGe, SiSn, and SiGe:C films and alloys.

In accordance with operational block 30, after silicon-containing material is deposited over the substrate, silicon-containing material can be selectively removed from portions of the substrate by flowing an etchant while continuing an inert carrier gas flow without hydrogen gas ($H_2$). For example, in embodiments that have a mixed substrate with insulator and semiconductor surfaces, silicon-containing material can be selectively removed from over the insulating surfaces following deposition. The etchant can include a halide, such as a fluorine-, bromine-, or chlorine-containing vapor compound. For example, the etchant can comprise HCl, HCl and $GeH_4$, HBr or $Cl_2$. In some embodiments, following a deposition process, an etchant will flow and selectively remove portions of the deposited silicon-containing material. While in some embodiments, an inert carrier gas used during the selective removal process can be different from an inert carrier gases used during the deposition process, in a preferred embodiment, the same inert carrier gas will be used during both the deposition and the selective etch processes. The inert gas flow can be maintained continuously during the deposition and etch processes. In some embodiments, the inert carrier gas can have the same constant flow rate during both the deposition and the selective etch processes to enhance throughput and minimize stabilization periods between phases. In contrast to the deposition phase, the period in which an etchant is introduced without a silicon-containing source vapor to remove portions of the deposited material is herein referred to as an "etch phase."

In some embodiments, the deposited silicon-containing material will be removed by using an etchant (e.g., HCl or HBr) along with a surface catalyst, e.g., a germanium source, such as monogermane ($GeH_4$), digermane ($Ge_2H_6$), $GeCl_4$, metallorganic Ge precursors or solid source Ge. In some embodiments, using a germanium source with the etchant helps to increase the etch rate in portions of the deposited silicon-containing material. In a preferred embodiment, the selective etch will take place using a significant amount of HCl and $GeH_4$. The inclusion of hydrogen during the selective etch process is optional. In some embodiments, the etch rate for non-epitaxial material can be between 10 nm/min and 200 nm/min. Accordingly, in some embodiments, minimal amounts of hydrogen can be present, so long as the primary carrier gas is inert, while in other embodiments, hydrogen is absent from the etching process (such as those involving $Cl_2$). In a preferred embodiment, the selective etch chemistry comprises HCl, $GeH_4$ and an inert carrier gas without using a hydrogen carrier gas.

In embodiments in which the selective formation of epitaxial material is by one or more cycles of selective deposition followed by an etch back process, one or more etchants can be introduced during both the deposition phase and the etch phase. While in some embodiments, an etchant will have a flow rate that is constant between the deposition and etch phases, in other embodiments, the etchant will have a flow rate that fluctuates from depositions to etch phases.

In accordance with operational block 40, after selectively removing silicon-containing material from the substrate, the deposition 20 and the selective removal 30 can form a cycle which can be repeated until a target thickness of silicon-containing material is achieved. The deposition and selective removal can be cycled two or more times until a desired thickness of silicon-containing material is achieved over a selected surface. Upon achieving a desired thickness of deposited silicon-containing material, the selective formation process can end 50. If a desired thickness of deposited silicon-containing material is not achieved after performing a first cycle, one or more additional cycles of deposition 20 and selective removal 30 processes can be repeated until a desired thickness is achieved. In some embodiments, the cycle can be repeated between two and sixty times. For each cycle, process parameters can vary to achieve exact results as desired by one skilled in the art.

Figure 2A:
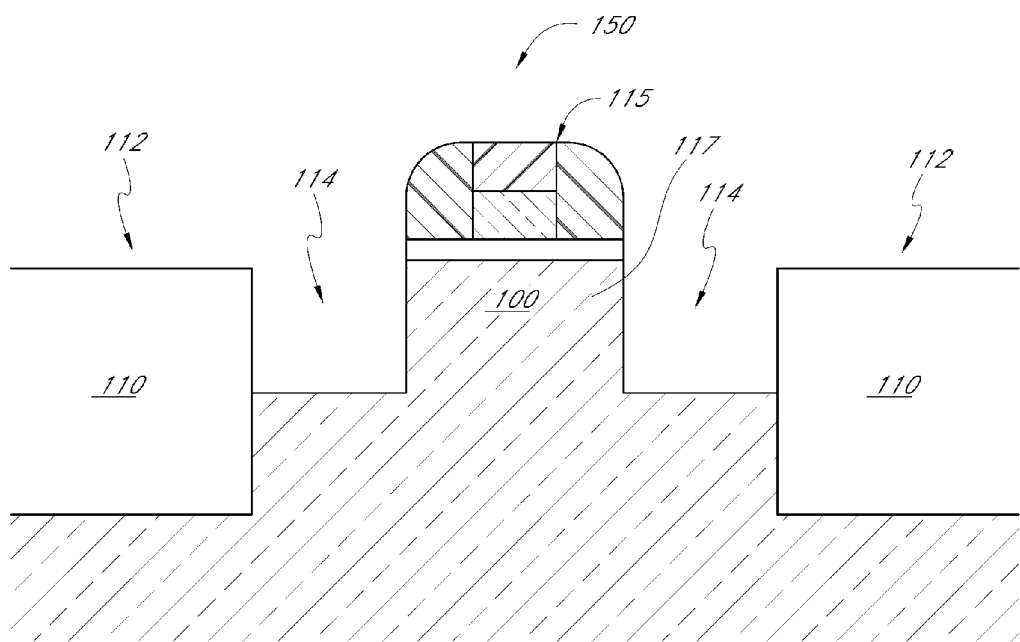
FIG. 2A is a schematic illustration of a partially formed semiconductor structure comprising patterned insulator regions formed in a semiconductor substrate.

FIGS. 2A-2F illustrate the formation of an elevated source and drain region using a blanket deposition and etch cycle according to one embodiment. FIG. 2A is a schematic illustration of a partially formed semiconductor structure 150 comprising a mixed semiconductor substrate 100 having a patterned insulator 110 formed therein. The illustrated insulator 110, in the form of oxide-filled shallow trench isolation (STI), defines field isolation regions 112 and is adjacent recessed source/drain regions 114 shown on either side of a gate electrode 115 structure. The gate electrode 115 overlies a channel region 117 of the substrate. Together, the channel 117 and source and drain regions 114 define a transistor active area, which is typically surrounded by field isolation regions 112 to prevent cross-talk with other devices. In other arrangements, multiple transistors can be surrounded by field isolation. In one case, the top of the gate structure 115, can be capped with a dielectric as illustrated. This surface then behaves similarly to the insulators 110 with respect to the deposition thereover, although nucleation and deposition rates will differ slightly over different low-k dielectric materials, and the conditions that maintain selectivity in the field isolation regions 112 will also apply to the top of the gate 115. In the case that the gate structure 115 is not capped with a dielectric, then the surface of the gate has the potential to grow polycrystalline material which then can be removed through in-situ etching of polycrystalline material, but a different set of selectivity conditions (pressure, gas flow, etc.) would apply, compared to those used to ensure no residual polycrystalline material on the field insulators 110.

The semiconductor structure 150 comprising the mixed semiconductor substrate 100 can be provided into a chemical vapor deposition chamber for processing. Suitable chambers are commercially available, and preferred models include the EPSILON® series of reactors available from ASM America, Inc. of Phoenix, Ariz.

Figure 2B:
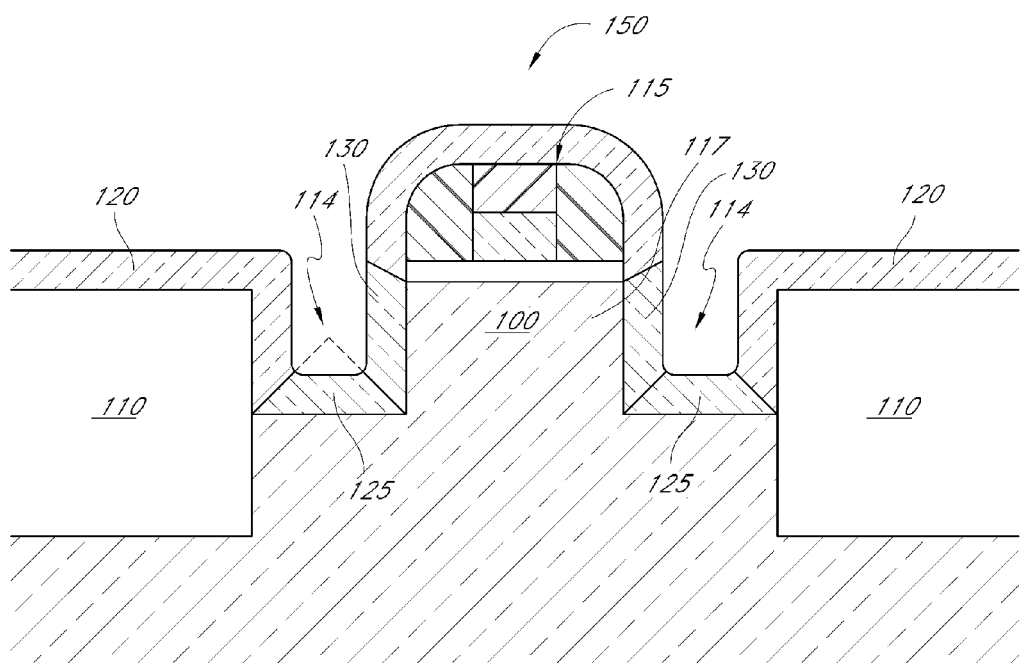
FIG. 2B is a schematic illustration of the partially formed semiconductor structure of FIG. 2A after performing a blanket deposition of silicon-containing material over the semiconductor substrate.

As shown in FIG. 2B, after providing the substrate into a chemical vapor deposition chamber, a blanket layer of silicon-containing material is deposited by flowing a silicon-containing source vapor and an inert carrier gas. Flowing the source vapor and carrier gas results in amorphous or polycrystalline (non-epitaxial) deposition 120 over insulators 110 in the field isolation regions 112, and lower epitaxial deposition 125 and sidewall epitaxial deposition 130 over the recessed source/drain regions 114. In some embodiments, the lower epitaxial deposition 125 and sidewall epitaxial deposition 130 can be "heteroepitaxial," whereby the deposited layers of crystalline material adopt the lattice constant of the underlying single crystal material. Note that "blanket deposition" means that net deposition results over both the amorphous insulators 110 and the single crystal regions 114 in each deposition phase. While lack of etchant (e.g., halides) is preferred in the blanket deposition, in which case the deposition can also be considered "non-selective," some amount of etchant might be desirable to tune the ratio of deposited thickness over the various regions, as discussed in more detail below. In case such small amounts of etchants are desirable, the deposition process can be partially selective but nevertheless blanket, since each deposition phase will have net deposition over both the insulators 110 and single crystal region 114.

The silicon-containing source vapor and inert carrier gas can be introduced into the chamber at a temperature between 500° C. and 600° C., more preferably between 525° C. and 575° C. In addition, the silicon-containing source vapor and the inert carrier gas can be introduced into the chamber at a reduced pressure between 10 Torr and 300 Torr, more preferably between 50 and 200 Torr. In some embodiments, the temperature or pressure of the chamber remain constant throughout both the deposition and selective etch processes. In a preferred embodiment, both the temperature and the pressure are kept constant throughout the deposition and selective etch processes to minimize the disturbance that occurs in the chamber caused by temperature and pressure fluctuations. The term "constant" as used throughout this application can include deviations due to control limits or alternatively about +/−5%. In some embodiments, it may be beneficial to provide a "split pressure recipe," in which the pressure during an etch phase varies from the deposition phase. For example, in some embodiments involving HCl etchant, the pressure will be increased during the etch phase relative to the deposition phase, while in other embodiments involving $Cl_2$ etchant, the pressure will be decreased during the etch phase relative to the deposition phase. This split pressure recipe may be particularly advantageous in order to achieve increased selectivity. While not bound by theory, it is believed that providing a split pressure recipe also allows for enhanced etching based on particular etchants. For example, while it is suitable to decrease the pressure during the etch phase when using $Cl_2$ (which includes two Cl atoms and is naturally more reactive) and still obtain a good etch rate, for HCl (which includes only one Cl atom), it may be beneficial to increase the pressure during the etch rate to increase etch kinetics.

The silicon-containing source vapor can be selected from any of the sources described above, including silane, disilane, dichlorosilane and trichlorosilane. In a preferred embodiment, the silicon-containing source precursor comprises trisilane. The silicon-containing source precursor can be introduced into a chamber for a period between 1 and 12 seconds, more preferably between 6 and 10 seconds, to produce a deposition of silicon-containing material over the entire substrate surface. In some embodiments, the silicon-containing source precursor can flow between 1 and 5 seconds. During the deposition process, the silicon-containing source precursor (e.g., disilane) will flow at a rate between about 20 sccm and 500 sccm, or for liquid precursors (e.g., trisilane) at a rate between about 25 mg/min and 500 mg/min, and preferably at a rate between about 100 mg/min and 300 mg/min.

The inert carrier gas can be selected from any of the carrier gases described above, including krypton, xenon, argon, helium or nitrogen. The inert carrier gas can be introduced prior to introducing silicon-containing source precursor. For example, in some embodiments, the inert carrier gas can be introduced and established for three to ten seconds before the silicon-containing source precursor is introduced. The inert carrier gas will have a flow rate during the deposition between 2 and 40 slm, more preferably between 10 and 15 slm. While in some embodiments, the inert carrier gas flow rate will remain constant, in other embodiments, the flow rate will vary between the ranges provided throughout the deposition phase.

A carbon source can be introduced simultaneously with the silicon-containing source precursor and inert carrier gas. The carbon source can comprise silylalkanes such as monosilylmethane, disilylmethane, trisylmethane and tetrasilylmethane, and/or alkylsilanes such as monomethyl silane (MMS) and dimethyl silane. In some embodiments, a carbon source comprises $H_3Si-CH_2-SiH_2-CH_3$ (1,3-disilabutane). The carbon source can be introduced during the deposition at a flow rate between 3 and 500 sccm, and in some embodiments, between 10 and 100 sccm. Introducing a carbon source with the silicon precursor and inert carrier gas results in the deposition of a carbon-doped silicon-containing epitaxial material. It has been found that this carbon-doped silicon-containing material has high substitutional carbon concentration $[C]_{sub}$. In a preferred embodiment, the deposited carbon-doped silicon-containing film has a substitutional carbon concentration $[C]_{sub}$ between 1 and 3%, as measured by a Kelieres/Berti relation. The skilled artisan will appreciate that the use of Vegard's Law to measure substitutional carbon concentration can produce a result that is higher than the application of a Kelieres/Berti relation. With either Vegard's Law or Kelieres/Berti, however, it is possible to approximate the amount of substitutional carbon that would be formed using the alternate process.

In some embodiments, a dopant source can also be provided during the deposition such that the deposited silicon-containing material is doped with, for example, phosphorus (P) or arsenic (As). Typical n-type dopant sources include arsenic vapor and dopant, hydrides, such as phosphine ($PH_3$) and arsine ($AsH_3$). Silylphosphines, for example $(H_3Si)_{3-x}PR_x$, and silylarsines, for example, $(H_3Si)_{3-x}AsR_x$, where x=0, 1 or 2 and $R_x$=H and/or deuterium (D), are alternative precursors for phosphorous and arsenic dopants. Phosphorous and arsenic are particularly useful for doping source and drain areas of NMOS devices. Such dopant precursors are useful for the preparation of films as described below, preferably phosphorous-, antimony-, indium-, and arsenic-doped silicon, Si:C, and SiGe:C films and alloys. Typical p-type dopant precursors include diborane ($B_2H_6$) and boron trichloride ($BCl_3$) for boron doping. Other p-type dopants for Si include Al, Ga, In, and any metal to the left of Si in the Mendeleev table of elements. Such dopant precursors are useful for the preparation of films as described below, preferably boron-doped silicon, SiGe, and SiGe:C films and alloys. In a preferred embodiment, the deposited silicon-containing film will be a phosphorous doped, carbon-containing silicon film.

Using an inert carrier gas as the primary carrier gas instead of hydrogen allows for a very efficient deposition process. It has been found that using an inert carrier gas, such as He or $N_2$ as the primary carrier gas without hydrogen allows for improved surface adsorption of silicon and carbon-containing source precursors, while reducing precursor consumption. For example, in one experiment, when using an inert carrier gas without hydrogen during a blanket deposition of silicon-containing material at 550° C., only 36% of the silicon-containing source vapor was required in order to obtain the same epitaxial growth rate as when using hydrogen as the primary carrier gas.

Figure 2C:
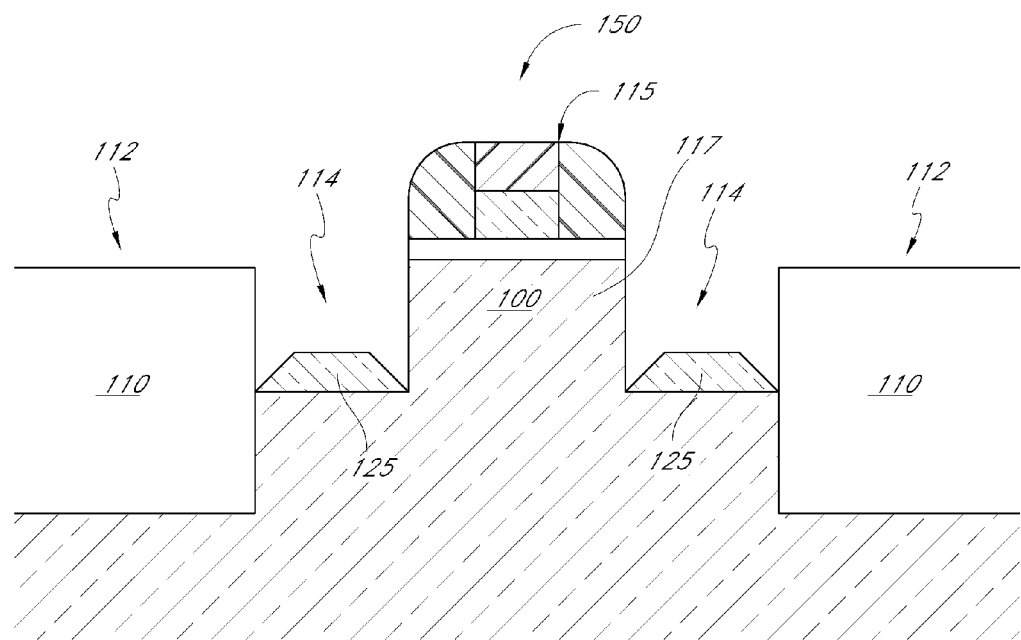
FIG. 2C is a schematic illustration of the partially formed semiconductor structure of FIG. 2B after performing a selective chemical vapor etch process to remove the silicon-containing material from insulator regions of the semiconductor substrate.

As shown in FIG. 2C, the regions of amorphous or polycrystalline deposition 120 and the sidewall epitaxial deposition 130 are selectively removed using an etchant while maintaining continuous flow of an inert carrier gas. Negligible amounts of epitaxially deposited carbon-doped silicon are removed from the lower epitaxial layer 125 in the recessed source and drain regions 114 during the selective etch. Instead, the sidewall epitaxial deposition 130 is much more readily removed than the lower epitaxial layer 125 because the sidewall epitaxial layer is of a different plane and can be more defective due to growth rate differential on the two surfaces than the lower epitaxial layer. Accordingly, each cycle of a deposition and etch process can be tuned to achieve largely bottom-up filling of the recesses 114. In some embodiments, epitaxial material can be left on the sidewalls if it is of good quality and does not hinder the goals of the selective fill such that the epitaxial deposition would not be entirely bottom-up.

The etchant can be selected from one or more of the etchants described above, including HCl or $Cl_2$. The etchant can be introduced into the chamber for a period between 1 and 15 seconds, and in some embodiments between 1 and 12 seconds. The etchant can have a flow rate between 25 and 2000 sccm, and more preferably at about 600 sccm. While in some embodiments, the etchant will flow at a constant rate during the selective etch, in other embodiments, the etchant flow will vary between two points (e.g., between about 550 sccm and 650 sccm) provided above. In some embodiments, while hydrogen can be used as a carrier gas in addition to the inert carrier gas during the selective removal process, in a preferred embodiment, an inert carrier gas will be used without hydrogen to achieve an improved selective etch rate. By using an inert carrier gas without hydrogen, a high partial pressure of the etchant can be maintained during the selective removal process, resulting in a significantly enhanced etch process, without having to adjust the flow rate of hydrogen carrier gas either during the selective removal process or between deposition and selective etch processes. In a preferred embodiment, an inert carrier gas will flow continuously during both the deposition and selective removal process.

In some embodiments, while an etchant such as hydrogen chloride or chlorine can be used without a germanium source during the selective removal process, in a preferred embodiment, the etchant is introduced with a germanium source to increase the selective etch rate, particularly for non-epitaxial (amorphous or polycrystalline) material. Germanium that is adsorbed on the surface of the deposited material is more easily diffused into non-epitaxial material, resulting in a more germanium rich surface for non-epitaxial material, which results in increased desorption of material from Ge-sites. In some embodiments, the germanium can flow between about 160 sccm and 200 sccm.

A single cycle of deposition followed by selective removal results in the growth of a lower epitaxial layer 125 comprised of carbon-doped silicon material. The cycle of deposition and selective removal can be repeated until a target thickness of epitaxial material is achieved over the source and drain recesses 114.

Figure 2D:
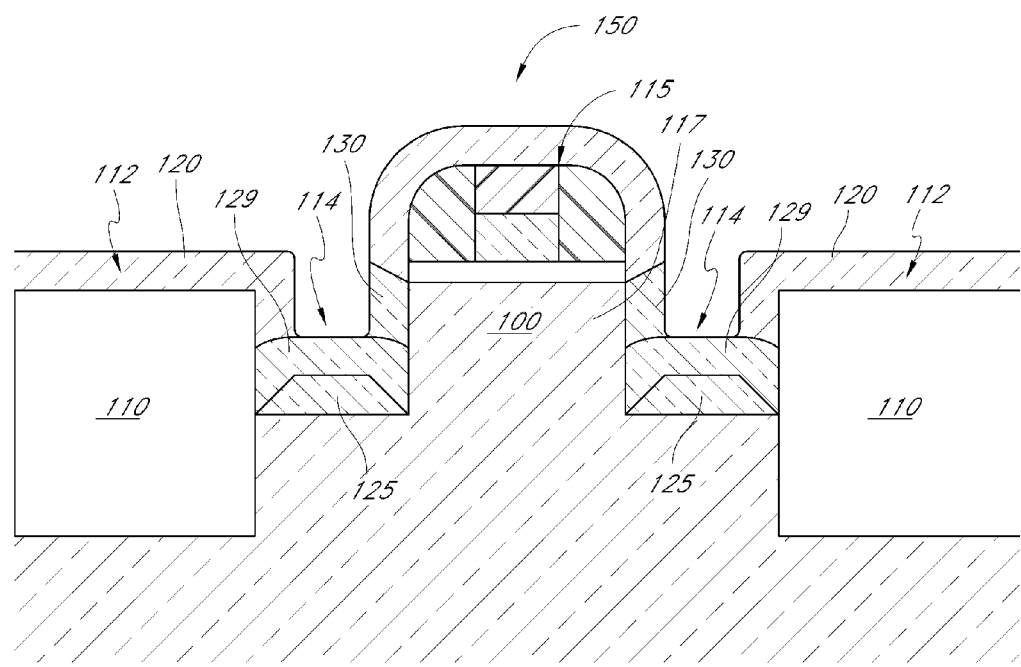
FIG. 2D is a schematic illustration of the partially formed semiconductor structure of FIG. 2C after performing a second blanket deposition of silicon-containing material over the semiconductor substrate.

FIG. 2D is a schematic illustration of the partially formed semiconductor structure of FIG. 2C after performing a second blanket deposition of carbon-doped silicon containing material using a silicon-containing source vapor precursor, a carbon source vapor and an inert carrier gas resulting in non-epitaxial deposition 120 over oxide regions 112, sidewall epitaxial deposition 130 and additional epitaxial deposition 129 over the existing lower epitaxial layer 125 in the recessed source/drain regions 114.

The deposited silicon-containing material will preferably exert a strain on the sidewalls of the recess 114 and channel 117. In some embodiments, the carbon-doped silicon-containing layer 129 will be tensile strained, which helps to enhance electron mobility and which is particularly desirable for NMOS devices. In other embodiments, the deposited silicon-containing material will be compressively strained, which helps to enhance hole mobility and which is particularly desirable for PMOS devices.

Figure 2E:
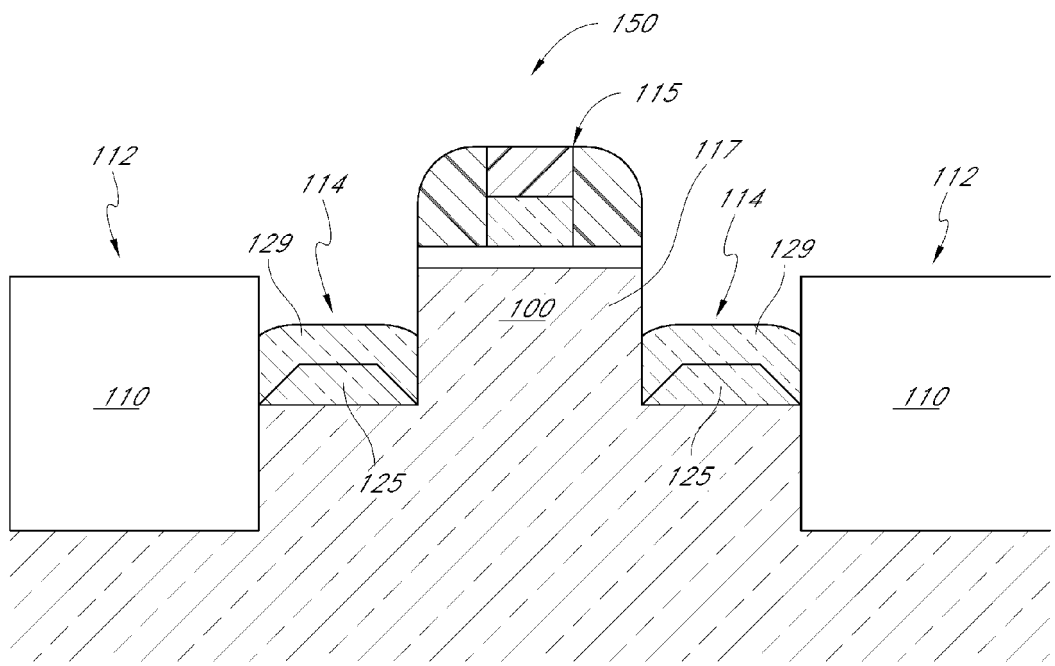
FIG. 2E is a schematic illustration of the partially formed semiconductor structure of FIG. 2D after performing a second selective chemical vapor etch process to remove the silicon-containing material from insulator regions of the semiconductor substrate.

FIG. 2E is a schematic illustration of the partially formed semiconductor structure of FIG. 2D after performing a selective chemical vapor etch process to remove the silicon-containing film from insulator regions of the mixed substrate. As shown in the illustrated embodiment, while non-epitaxial material 120 and sidewall epitaxial material 130 have been selectively removed, epitaxial material 129 remains over the lower epitaxial layer 125.

In some embodiments, epitaxial layer 129 can possess similar properties to the lower epitaxial layer 125. In other embodiments, the epitaxial layer 129 can possess different properties from the lower epitaxial layer 125, depending on deposition conditions and choice of precursors used during the second blanket deposition process. For example, the epitaxial layer 129 can have a higher substitutional carbon concentration and induce an even higher tensile strain than lower epitaxial layer 125 on semiconductor substrate channel 117. Subsequent bottom-up epitaxial layers (such as epitaxial layer 139 shown in FIG. 2F and epitaxial layer 149 shown in FIG. 2G) can induce even greater strain than layers beneath.

Figure 2F:
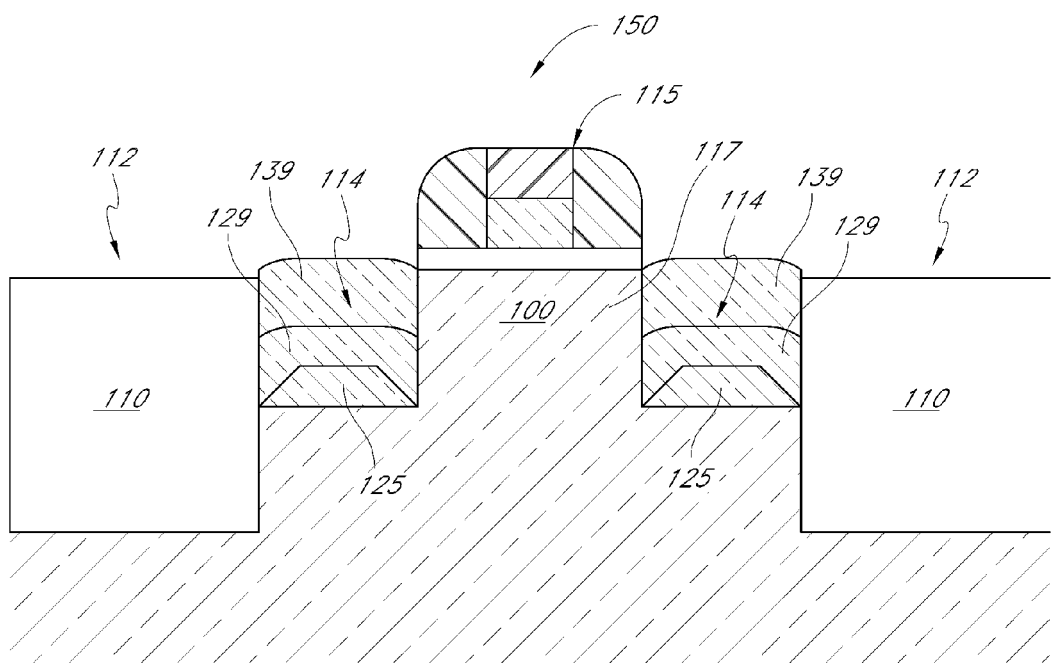
FIGS. 2F-2G are schematic illustrations of the partially formed semiconductor structure of FIG. 2E after performing further cycles of blanket deposition and selective etch.
Figure 2G:
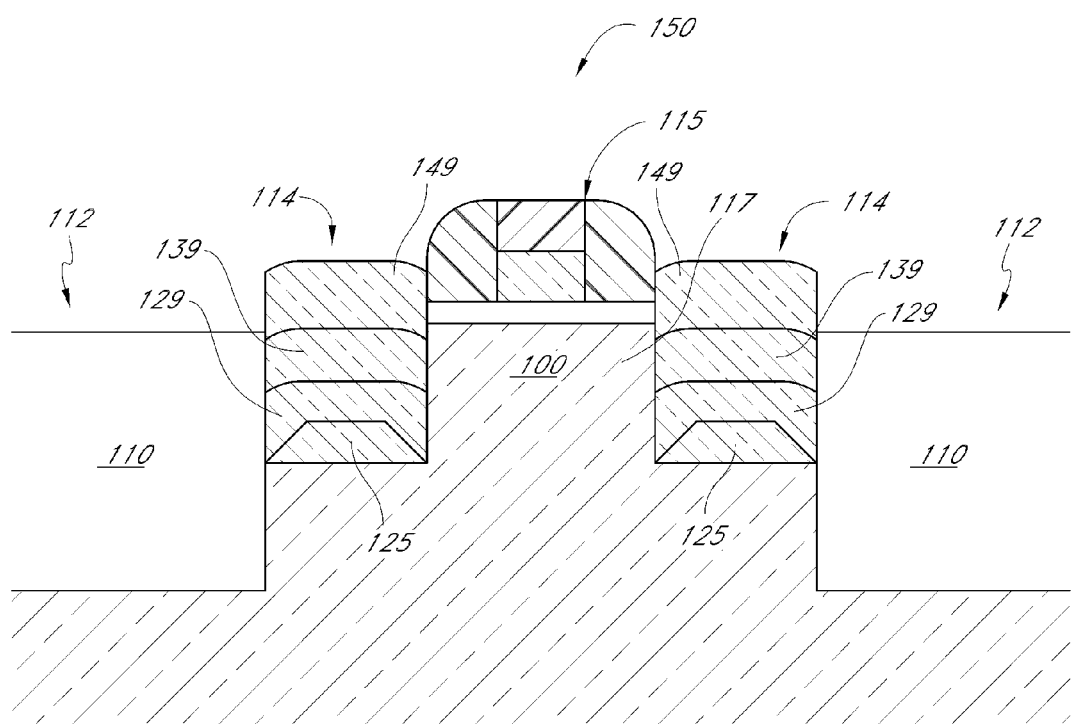

FIGS. 2F-2G are schematic illustrations of the partially formed semiconductor structure of FIG. 2E after performing further cycles of blanket deposition and selective etch. Cycles of blanket deposition and selective etch can be repeated until a desired thickness of carbon-doped silicon containing material is deposited. As shown in FIG. 2F, a third cycle of blanket deposition and selective etch is performed to form a third layer 139 above layers 129 and 125. As shown in FIG. 2G, a fourth cycle of blanket deposition and etch is performed to form a fourth layer 149 that acts as an elevated source and drain layer above layers 139, 129 and 125. One skilled in the art will appreciate that more or less epitaxial layers can be deposited besides those shown in FIGS. 2A-2G.

Figure 3A:
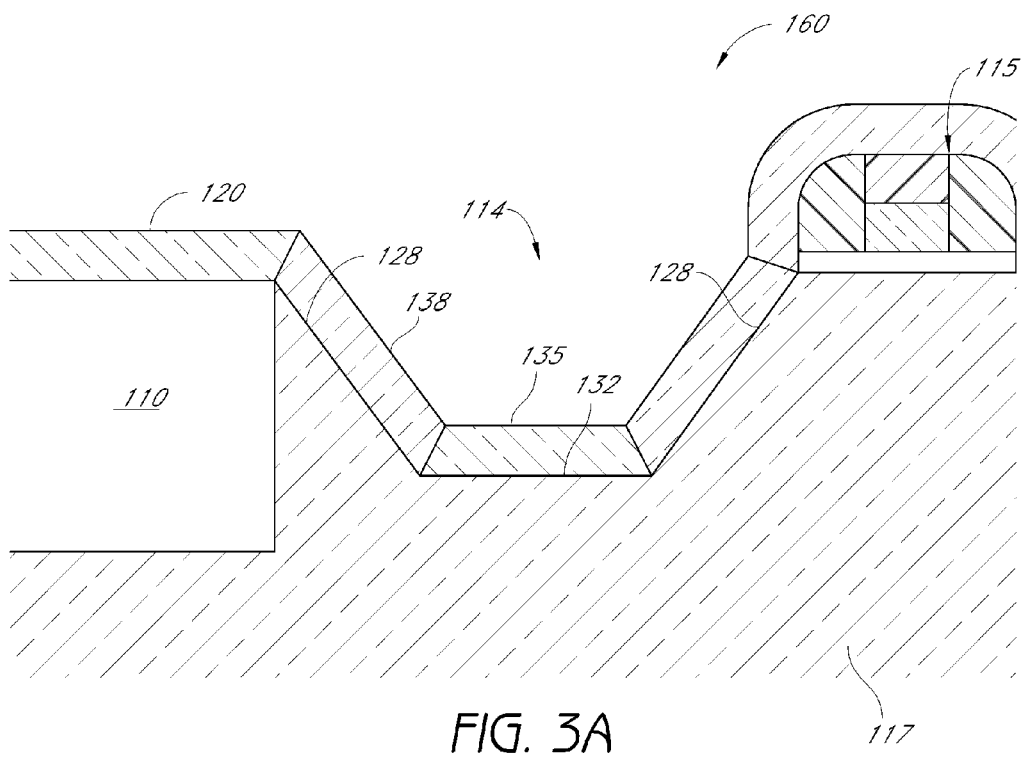
FIG. 3A is a schematic illustration of a partially formed semiconductor structure having an insulator and a recess with sloped sidewalls after performing a blanket deposition of carbon-containing silicon material.

FIG. 3A is a schematic illustration of a partially formed semiconductor structure 160 having a semiconductor substrate after performing a blanket deposition of a carbon-doped silicon-containing layer. The semiconductor substrate is comprised of an insulator 110 adjacent to a recess 114 having a flat bottom surface 132 and sloped sidewalls 128. The recess sidewalls 128 are of a different crystalline plane than the base 135. While the base 135 can have a crystalline plane of <001>, the recess sidewalls 128 can have a different crystalline plane, such as <111> or <011>. On the side of the recess is a gate electrode 115 structure which overlies a channel region 117 of the substrate.

The semiconductor substrate is provided into a chemical vapor deposition chamber, wherein a blanket deposition process takes place. The blanket deposition process takes place using trisilane as a silicon-containing source vapor. During the blanket deposition a carbon-containing source vapor and an inert carrier gas (such as He or $N_2$) are introduced with trisilane to deposit epitaxial material 135 on the base 132 and sidewalls 128, as well as non-epitaxial material (amorphous or polycrystalline) on the insulator 110. While in some embodiments, the epitaxial material 138 on the recess sidewalls 128 is of similar quality to the epitaxial material 135 on the base 132, in the illustrated embodiment, the epitaxial material 138 is of lesser quality than the high quality epitaxial material 135 and will subsequently be removed during the selective etch process (as shown in FIG. 3B).

In accordance with FIG. 3A, the material that is deposited comprises a carbon-doped silicon-containing material. Using the deposition process described above, epitaxial material having high substitutional carbon concentration [C] will be deposited in the recess 114. The substitutional carbon concentration [C] will be between 1.0 at. % and 3.25 at. % as-deposited using the Kalieres/Berti relation. In other embodiments, a dopant source such as $PH_3$ can also be provided during the deposition phase such that the deposited material is a silicon-containing material doped with phosphorus.

The silicon-containing source vapor will flow for a duration between 1 and 10 seconds, more preferably between 1.5 and 2 seconds, before ceasing. While the silicon-containing source vapor has been stopped, the inert carrier gas will continue to flow, preferably at the same constant rate as during the blanket deposition process.

Figure 3B:
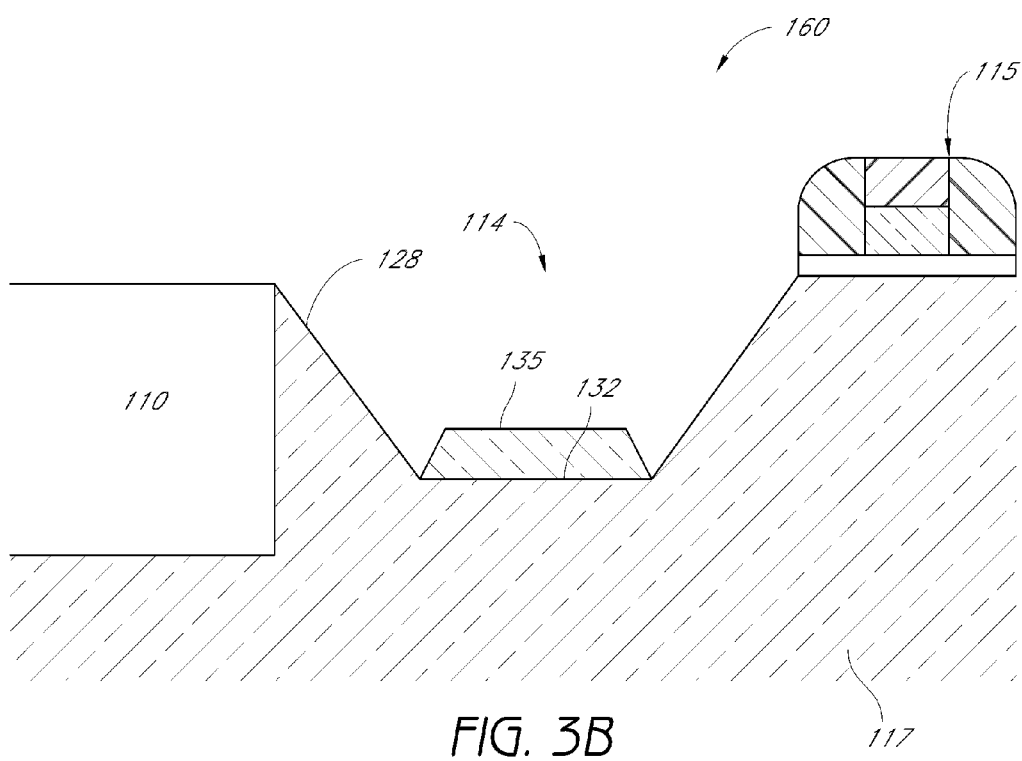
FIG. 3B is a schematic illustration of the partially formed semiconductor structure of FIG. 3A after performing a selective chemical vapor etch process to remove portions of the carbon-containing silicon material from the insulator and recess sidewalls.

FIG. 3B is a schematic illustration of the partially formed semiconductor structure 160 of FIG. 3A after performing a selective chemical vapor etch process to remove portions of the deposited material from the insulator 110 and recess sidewalls 128. While non-epitaxial material 120 and epitaxial material 128 are removed from the surfaces of the insulator 110 and recess sidewalls 128, epitaxial growth of high quality carbon-doped silicon-containing material 135 remains on the base 132 of the recess 114.

During the selective vapor etch, an etchant will be introduced, while maintaining the flow of an inert carrier gas. The etchant can be accompanied by monogermane ($GeH_4$) to increase the etch rate such that the etch rate for the non-epitaxial material is greater than 100 nm/min. The inert carrier gas will preferably flow at the same constant rate as during the deposition process. However, in some embodiments, the inert carrier gas can flow at a rate that varies between deposition and etch phases. For one embodiment, an inert carrier gas can flow at a rate between 5 slm and 13 slm during deposition, while flowing at a rate of between 0.5 slm and 2 slm during an HCl etch. In another embodiment, an inert carrier gas can flow at a rate between 5 slm and 13 slm during deposition, while flowing at a rate of about 40 slm during a $Cl_2$ etch. During the selective etch, the non-epitaxial material 120 and low quality epitaxial material 128 will be removed at a much faster rate than the epitaxial material 135 on the base 132 of the recess.

The deposition and selective vapor etch therefore comprise a cycle which can be repeated to form growth of carbon-doped silicon-containing material, such as layer 135. This cycle can be repeated until a desired thickness of material is achieved in the recess 114.

Figure 4A:
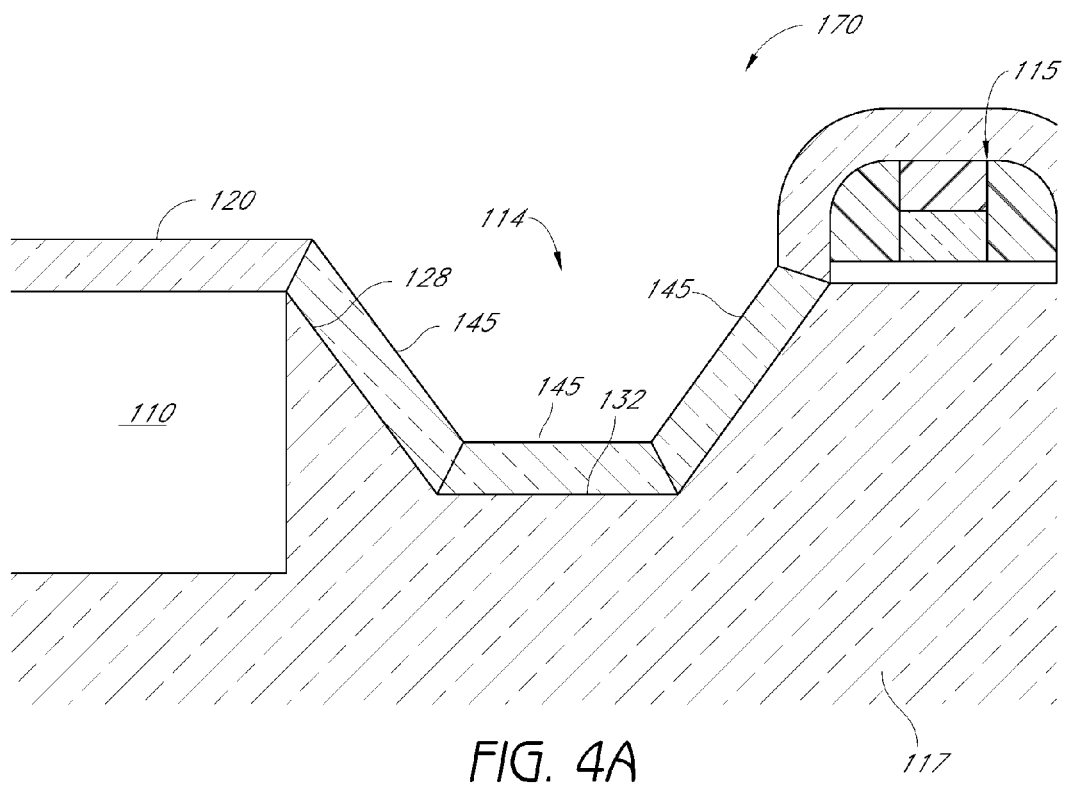
FIG. 4A is a schematic illustration of a partially formed semiconductor structure having an insulator and a recess with sloped sidewalls after performing a blanket deposition of germanium-containing silicon material.

FIG. 4A is a schematic illustration of a partially formed semiconductor structure 170 having an insulator 110 and a recess 114 with sloped sidewalls 128 after performing a blanket deposition of a silicon-containing layer having germanium incorporated therein. The recess sidewalls 128 are of a different crystalline plane than the base 135. While the base 135 can have a crystalline plane of <001>, the recess sidewalls 128 can have a different crystalline plane, such as <111> or <011>. On the side of the recess is a gate electrode 115 structure which overlies a channel region 117 of the substrate.

The semiconductor substrate is provided into a chemical vapor deposition chamber, wherein a blanket deposition process takes place. During the blanket deposition, a silicon-containing source vapor, germanium source vapor and an inert carrier gas are introduced to deposit epitaxial material 145 on the base 132 and recess sidewalls 128, and non-epitaxial (amorphous or polycrystalline) material on the insulator 110. While some embodiments can also include hydrogen gas, in a preferred embodiment, the inert carrier gas will flow without hydrogen gas. In contrast to the embodiment illustrated in FIGS. 3A-3B, the epitaxial material 145 that is deposited on the recess sidewalls 128 is of the same quality or of similarly high quality as that deposited on the recess base 132.

The germanium source that flows with the silicon-containing source vapor and inert carrier gas comprises monogermane ($GeH_4$). The material that is deposited over the semiconductor structure comprises a silicon-containing material with germanium incorporated therein.

Figure 4B:
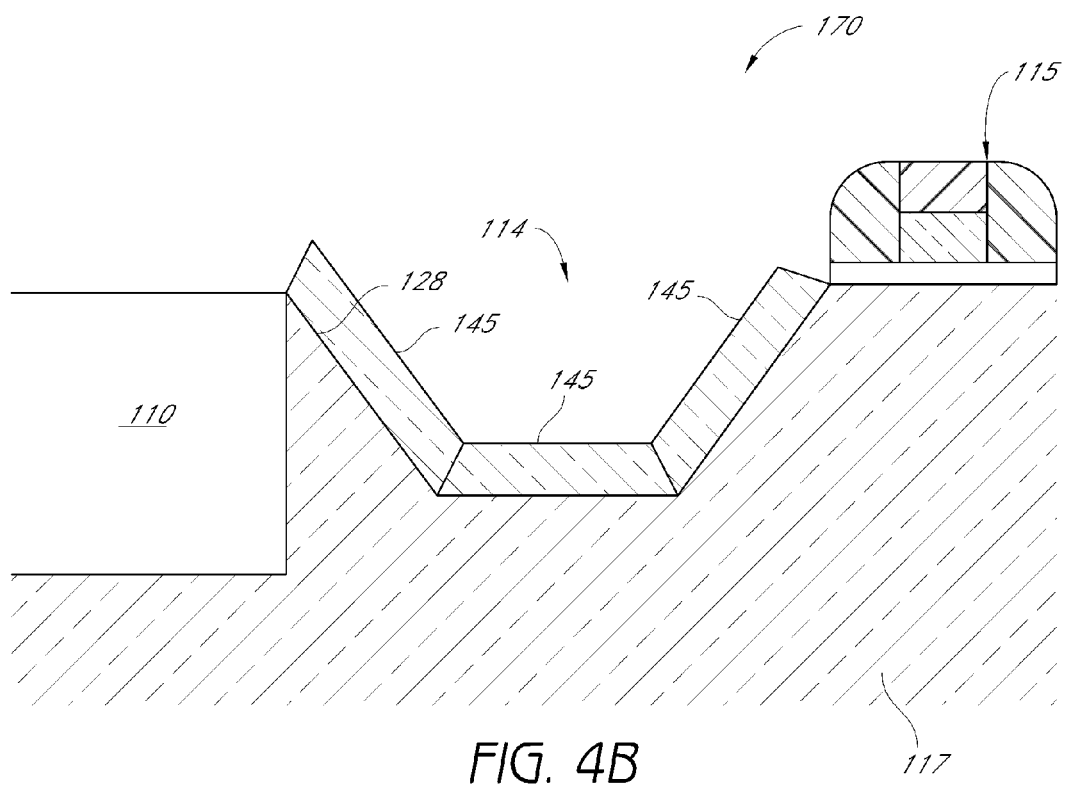
FIG. 4B is a schematic illustration of the partially formed semiconductor structure of FIG. 3B after performing a selective chemical vapor etch process to remove portions of the germanium-containing silicon material from the insulator.

FIG. 4B is a schematic illustration of the partially formed semiconductor structure 170 of FIG. 4A after performing a selective chemical vapor etch process to remove portions of the silicon-containing layer from the insulator 110. While non-epitaxial material 120 is selectively removed from the surfaces of the insulator 110, epitaxial growth of high quality silicon-containing material 145 remains on the base 132 and sidewalls 128 of the recess 114.

During the selective etch, a flow of etchant will be introduced, while maintaining the flow of inert carrier gas. The etch chemistry preferably comprises HCl accompanied by monogermane ($GeH_4$). In a preferred embodiment, the inert carrier gas will flow without hydrogen gas. During the selective etch, the non-epitaxial material 120 will be removed at a much faster rate than the epitaxial material 145, resulting in bottom-up growth of epitaxial material in the recess 114. In some embodiments, the ratio of the rate of etching of silicon-containing material over the insulating surface to the rate of etching silicon-containing material over the recess is between 20:1 and 200:1.

The blanket deposition and selective vapor etch therefore comprise a cycle which can be repeated to form growth of silicon-containing material 145 along the recess base and sidewalls. This cycle can be repeated until a desired thickness of material is achieved.

While cycles of blanket deposition and etch have been described and illustrated above in FIGS. 2A-4B, the skilled artisan will appreciate that the deposition phase need not be blanket. Rather, one or more etchants can be introduced during the deposition process such that the deposition process is at least partially selective or completely selective. Any of the etchants described above, including HCl and $Cl_2$, can be introduced during the selective deposition process along with a silicon-containing source vapor. In some embodiments, while the flow of the silicon-containing source vapor is stopped, the etchant may flow continuously to etch back silicon-containing material deposited during the selective deposition. In embodiments in which the etchant flows continuously between the deposition and etch processes, the etchant flow rate can be ramped up or ramped down between deposition and etch processes rather than remain constant.

By using the cyclical processes described above, it is possible to achieve a higher throughput over conventional processes. Various benefits of performing a cyclical deposition and selective removal process using a continuous inert gas flow without hydrogen are described above. In addition, various benefits are described that relate to reducing the inert gas flow rate during the etch phase, adding germanium during the deposition and/or etch process, and modulating pressure during the etch phase relative to the deposition phase in a split pressure process.

Example Process Parameters

Example 1

Recipe for a Single Cycle Blanket Deposition and Selective Etch

Example process parameters are summarized in Table A below, which lists operating ranges for a single cycle of a selective formation process according to one embodiment. Optional ranges are provided in parenthesis. The process conditions such as chamber temperature and chamber pressure are kept constant throughout the selective epitaxial formation process, thereby allowing high throughput.

TABLE A

| TABLE A | Process Phase | |
|---|---|---|
|  | Blanket Deposition | Selective Etch |
| duration (sec) | 1-12 | 1-24 |
| rotation speed (rpm) | 50-200 | 50-200 |
| temp (° C.) | 525-650 | 525-650 |
| pressure (Torr) | 150-200 | 150-200 |
| inert carrier gas flow (slm) | 5-10 | 1-3 |
| Ge-source flow (sccm) | 0 | 160-200 |
| Si-source flow (mg/min) | 30-200 | 0 |
| MMS flow (sccm) | 3-300 | 0 |
| PH$_3$ flow (sccm) | 6-1000 | 0 |
| HCl flow (sccm) | (500-2000) | 600 |

As shown in Table A, a blanket deposition process takes place between 1 and 12 seconds. The blanket deposition takes place at a temperature between 525° C. and 650° C. and pressure between 150 and 200 Torr. These conditions will remain relatively constant throughout the deposition process. During the blanket deposition process, a silicon-source will flow at a rate of about 30 and 200 mg/min, MMS will flow at a rate of between 3 and 300 sccm, PH$_3$ will flow at a rate between 6 and 1000 sccm, and an inert carrier gas will flow at a rate between 5 and 10 slm. No hydrogen is present during the blanket deposition.

The blanket deposition is followed by a selective etch process that takes place between 1 and 24 seconds. Like the blanket deposition, the selective etch takes place at a temperature between 525 and 650° C. and pressure between 150 and 200 Torr. These conditions will remain relatively constant throughout the selective etch process. During the selective etch process, HCl will flow at a rate of about 600 sccm, a germanium-source will flow at a rate between 160 and 200 sccm, and an inert carrier gas will flow at a rate between 1 and 3 slm. No hydrogen will be present during the selective etch process.

Although not shown in Table A, an optional purge gas can be provided either between the deposition and etch processes.

In a preferred embodiment, no purge will be necessary, therefore reducing the processing time and increasing the overall throughput of the selective epitaxial formation process.

Example 2

Recipe for a Repeated Blanket Deposition and Selective Etch Cycle

In one embodiment, fifty cycles of a blanket deposition and selective were performed, resulting in the deposition of a Si:C:P layer having a high substitutional carbon incorporation. The blanket deposition and selective etch processes were performed at a constant temperature of 600° C. and constant pressure of 175 Torr throughout the entire selective formation process. No purging was used between any of the deposition and etch processes.

During each blanket deposition phase, trisilane (Si$_3$H$_8$) was introduced at approximately 36 mg/min with phosphine (PH$_3$) at between about 6-12 sccm to deposit phosphorous doped silicon-containing material. With the exception of the first blanket deposition, a MMS-source was provided at a flow rate of 3 sccm during each blanket deposition to incorporate carbon into the silicon-containing layer as deposited. An inert carrier gas comprised of He or N$_2$ having a flow rate of 10 slm was also provided. The duration of each blanket deposition varied between 1 and 12 seconds. For each blanket deposition phase, the epitaxial growth rate was found to be between 30 and 34 nm/min. The resultant carbon substitutionality, notwithstanding the impact of the PH$_3$ dopant, was proportional to the flow of the MMS and was approximately 100%.

During each selective etch phase, HCl was introduced at a flow rate of approximately 2000 sccm with GeH$_4$ at a flow rate of approximately 160-200 sccm. The He or N$_2$ flow remained at a constant rate during the selective etch phase as during the blanket deposition. The duration of the each selective etch phase was kept constant at approximately 12 seconds. After each selective etch phase, the germanium GeH$_4$ incorporation was constant and each cycle of a blanket deposition and selective etch formed approximately 0.5 monolayers (ML), or approximately 0.0723 nm of silicon-containing material. The epitaxial etch rate was between 9 and 11 nm/min.

As the overall selective deposition process did not require any change in pressure, temperature or inert carrier gas flow, and no time consuming purge step was required in between deposition and etch processes, a selective process having a high throughput was achieved.

Example 3

Recipe for a Repeated Selective Deposition and Etch Cycle

Example process parameters are summarized in Table B below, which lists operating ranges for a repeated selective deposition and etch cycle according to one embodiment. The process conditions such as chamber temperature and chamber pressure were kept constant throughout the selective process, thereby allowing high throughput. In the illustrated embodiment, the temperature was kept constant at 525° C., while the pressure was kept constant at 200 Torr.

TABLE B

| | Pre-Deposition | Deposition | Purge | Etch | Purge | Cycle to Deposition (30x) |
|---|---|---|---|---|---|---|
| duration (sec) | 5 | 2.4-3.6 | 3 | 6 | 3 | 0.1 |
| token | vent | dep | Dep | dep | dep | dep |
| temp (° C.) | 525 | 525 | 525 | 525 | 525 | 525 |
| pressure (Torr) | 200 | 200 | 200 | 200 | 200 | 200 |
| He flow (slm) | 10 | 10 | 1 (R) | 1 | 10 (R) | 10 |
| $Si_3H_8$ flow (mg/min) | 100 | 100 | | | 100 (V) | 100 (V) |
| MMS flow (sccm) | 50 | 50 | 50 (V) | 50 (V) | 50 (V) | 50 (V) |
| $PH_3$ flow (sccm) | 75 | 75 | 75 (V) | 75 (V) | 75 (V) | 75 (V) |
| HCl flow (sccm) | 200 | 200 | 200 | 200 | 200 | 200 |
| $GeH_4$ (sccm) | 10 | 10 | 10 | 10 | 10 | 10 |

A substrate was provided into a chemical vapor chamber, the substrate comprising a recess adjacent to an insulator. As illustrated in Table B, a pre-deposition process was performed whereby a silicon-containing source vapor ($Si_3H_8$) was introduced into a chamber. This pre-deposition process occurred once during the entire selective formation process. After the pre-deposition process, a selective deposition was performed in which an etchant (HCl) flowed with a silicon-containing source vapor ($Si_3H_8$), carbon-source vapor (MMS), dopant precursor ($PH_3$), and inert carrier gas (He). The inert carrier gas was introduced at a first flow rate (10 slm) during deposition. No hydrogen carrier gas was used during the selective deposition process (or anywhere else throughout the entire process). In the illustrated embodiment, the HCl etchant was introduced simultaneously with the silicon-containing source precursor. The flow rate of the HCl etchant during the deposition process was 200 sccm and remained constant throughout the deposition process. In addition to the HCl etchant, a germanium-source ($GeH_4$) was also provided during the deposition process.

Figure 5:
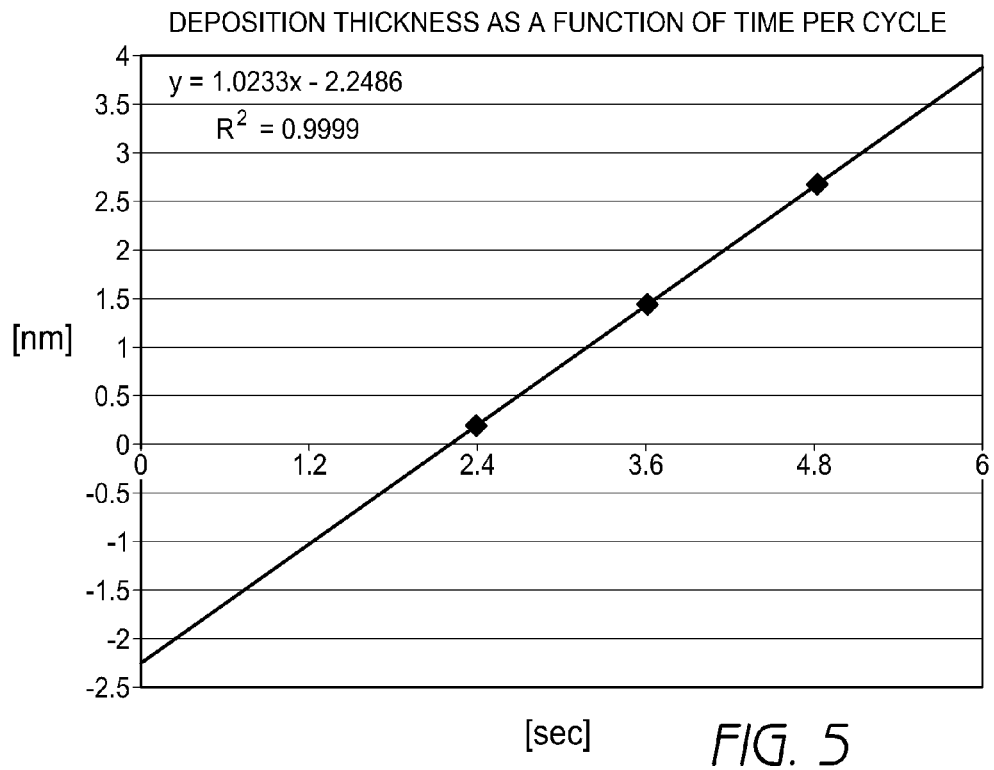
FIG. 5 is a graph showing the approximate deposition thickness as a function of time according to one embodiment.

The deposition process resulted in an epitaxial growth rate of approximately 1.02 nm/sec (or 61.4 nm/min) as shown in FIG. 5, which shows the approximate deposition thickness in nanometers as a function of time in seconds using the parameters of the illustrated embodiment.

After a period of flowing the silicon-containing source vapor (e.g., between 2.4 and 3.6 seconds), the silicon-containing source vapor flow was stopped. While not illustrated in this embodiment, the carbon-containing source vapor flow can also be stopped with the silicon-containing source vapor. Upon stopping the flow of silicon-containing source vapor, a purging process occurred for approximately 3 seconds to remove the silicon-containing source vapor. During this purging process, the flow rate of the inert carrier gas was ramped down from approximately 10 slm to 1 slm or less. In addition, during the purging process, the flow rate of the $GeH_4$ germanium-source was ramped up to 50 sccm. Maintaining a small amount of $GeH_4$ germanium-source flow (e.g., 10 sccm) during the deposition process was found to assist in depositing silicon-containing material having high substitutional carbon, while increasing the amount of the $GeH_4$ germanium-source flow (e.g., to 50 sccm) following deposition helped to provide for a high etch rate during the etchant process.

Figure 6:
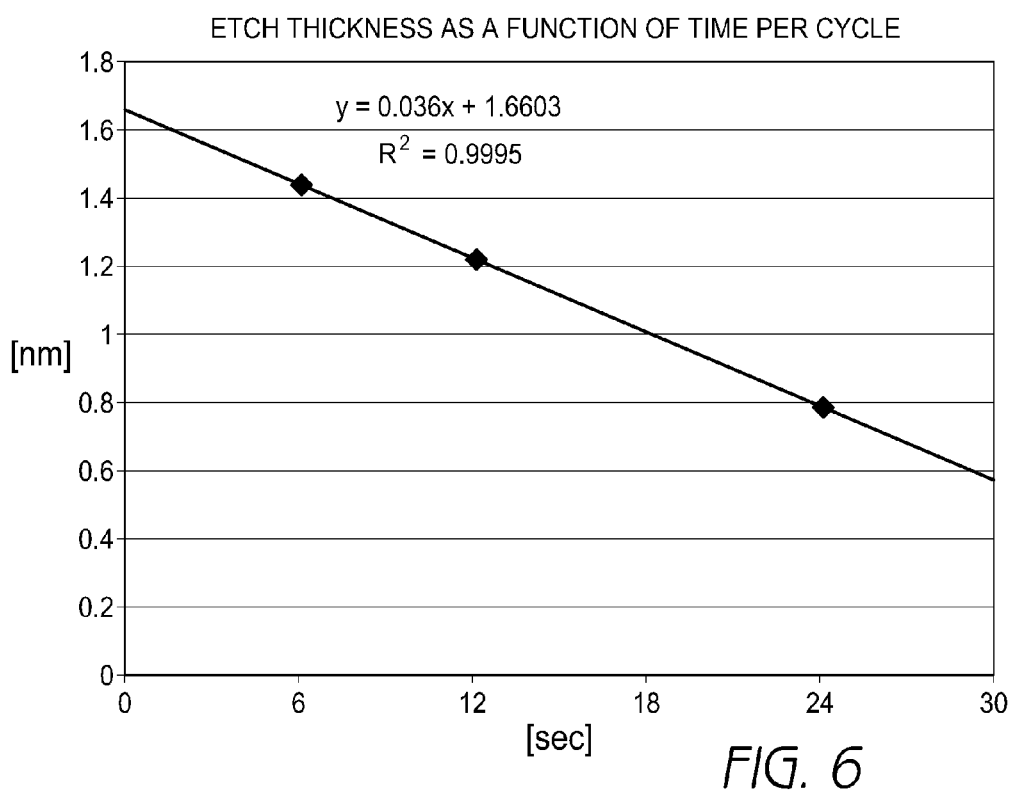
FIG. 6 is a graph showing the approximate thickness of material etched as a function of time according to one embodiment.

Following the purging process, an etch process was performed in which deposited silicon-containing material was etched back. In the illustrated embodiment, the etchant (HCl) remained at the same constant flow rate of 200 sccm as during the selective etch process. The inert carrier gas, which was ramped down to 1 slm from 10 slm during the purging process, remained at 1 slm during the etching process. The inert carrier gas thus flowed during the etchant phase at a flow rate less than the first flow rate of the inert carrier gas. It was found that keeping the inert carrier gas flow rate low during the etchant process helped to maintain a high HCl etchant partial pressure and provide for a high etch rate for epitaxial Si:C:P of approximately 0.036 nm/second or 2.16 nm/min as shown in FIG. 6, which shows the approximate thickness of material etched as a function of time in seconds per cycle using the parameters of the illustrated embodiment.

Following the etch process, another purging process can be provided wherein the silicon-containing source vapor is again provided. The purging process signifies the end of the etching process and the beginning of a deposition process, and hence, the start of an additional cycle of selective deposition and etch. During this purging process, the inert carrier gas flow rate is ramped back up to 10 slm. The cycle of selective deposition and etch is repeated 20-50 times until a desired amount of silicon-containing material is deposited.

It will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

What is claimed is:

1. A method for selectively forming silicon-containing material over single crystal semiconductor surfaces, comprising:
    providing a substrate, the substrate comprising insulating surfaces and single-crystal semiconductor surfaces;
    depositing silicon-containing material over the insulating surfaces and single crystal semiconductor surfaces of the substrate by flowing a silicon-containing source vapor and an inert carrier gas without flowing $H_2$;
    selectively removing silicon-containing material from over the insulating surfaces by flowing an etchant while maintaining continuous flow of the inert carrier gas without flowing $H_2$; and
    cycling the deposition and selective removal two or more times until a desired thickness of silicon-containing material over the single crystal semiconductor surfaces is achieved, wherein the inert carrier gas is continuously flowed without $H_2$ throughout the cycling.

2. The method of claim 1, wherein the inert carrier gas comprises He.

3. The method of claim 1, wherein the inert carrier gas comprises $N_2$.

4. The method of claim 1, wherein the inert carrier gas flows at a rate between 5 and 10 slm during the deposition process.

5. The method of claim 1, wherein the inert carrier gas flow remains constant during both the deposition and selective removal processes.

6. The method of claim 1, wherein depositing silicon-containing material takes place at a constant temperature between 500 and 600° C.

7. The method of claim 1, wherein depositing silicon-containing material by flowing a silicon-containing source vapor takes place for between 1 and 5 seconds.

8. The method of claim 1, wherein selectively removing silicon-containing material takes place for between 1 and 15 seconds.

9. The method of claim 1, further comprising introducing a carbon-source gas comprised of monomethyl silane (MMS) with the silicon-source containing vapor and inert carrier gas during the deposition of silicon-containing material.

10. The method of claim 9, wherein the monomethyl silane (MMS) flows at a rate between 10 sccm and 100 sccm during the deposition of silicon-containing material.

11. The method of claim 1, wherein the silicon-containing material deposited in the recess forms a strained heteroepitaxial film.

12. The method of claim 1, wherein the silicon-containing material deposited on the single crystal semiconductor surfaces is carbon-doped.

13. A method for selectively forming silicon-containing material in a recess, comprising:
  providing a substrate into a chemical vapor deposition chamber, the substrate comprising a recess and an adjacent insulating surface;
  depositing epitaxial material over the recess and non-epitaxial material over the adjacent insulating surface by flowing trisilane and an inert carrier gas in the chamber, wherein the inert carrier gas flows at a constant rate;
  selectively removing portions of the non-epitaxial material from over the insulating surface by flowing an etchant while maintaining a continuous flow of the inert carrier gas in the chamber; and
  repeating a cycle of deposition and the selective removal in the same chamber until a desired thickness of silicon-containing material is deposited in the recess, wherein the inert carrier gas is flowed continuously throughout the depositing, selectively removing, and repeating.

14. The method of claim 13, wherein the inert carrier gas comprises He.

15. The method of claim 13, wherein the inert carrier gas comprises $N_2$.

16. The method of claim 13, wherein the deposited silicon-containing material is tensile strained.

17. The method of claim 13, wherein the deposited silicon-containing material is a silicon-carbon material doped with phosphorus.

18. The method of claim 13, wherein depositing epitaxial material comprises blanket depositing epitaxial material.

19. The method of claim 13, wherein depositing epitaxial material comprises selectively depositing epitaxial material.

20. The method of claim 13, wherein the inert carrier gas flow rate is maintained at the same constant flow rate during selectively removing portions of the non-epitaxial material as during depositing the epitaxial material.

21. The method of claim 13, wherein the etchant comprises HCl and the inert carrier gas flow rate is reduced during selectively removing portions of the non-epitaxial material relative to the inert carrier gas flow rate during depositing epitaxial material.

22. The method of claim 13, wherein the etchant comprises $Cl_2$ and the inert carrier gas flow rate is increased during selectively removing portions of the non-epitaxial material relative to the inert carrier gas flow rate during depositing epitaxial material.

23. A method for selectively forming carbon-doped silicon-containing material in a recess comprising:
  providing a substrate into a chemical vapor deposition chamber, the substrate comprising a recess adjacent to an insulator;
  introducing a silicon-containing source vapor, a carbon-containing source vapor and an inert carrier gas to deposit carbon-doped silicon-containing material on the recess and insulator, wherein the inert carrier gas is introduced at a first flow rate;
  stopping the flow of silicon-containing source vapor and carbon-containing source vapor while varying the inert carrier gas flow rate;
  flowing an etchant to etch material from the insulator while flowing the inert carrier gas at a second flow rate less than the first flow rate of the inert carrier gas; and
  repeating the cycle of depositing and etching until a desired thickness of material is achieved in the recess, wherein the inert carrier gas is flowed continuously throughout the introducing, stopping, flowing of etchant, and repeating.

24. The method of claim 23, wherein the inert carrier gas flows at a rate of between 5 and 13 slm during deposition.

25. The method of claim 23, wherein the inert carrier gas flows at a rate of about 40 slm.

26. The method of claim 23, wherein the deposited carbon-doped silicon-containing material in the recess has a substitutional carbon concentration [C] between 1 and 3%.

27. The method of claim 23, wherein the etchant comprises HCl.

28. The method of claim 27, further comprising introducing $GeH_4$ during the etching process.

29. The method of claim 23, wherein the etchant comprises $Cl_2$.

30. The method of claim 23, wherein the deposition process take place at a temperature between 525° C. and 575° C.

31. The method of claim 23, wherein the etchant is first introduced into the chamber during the deposition process as part of a selective deposition process.

32. The method of claim 23, wherein material is etched from the insulator at a rate greater than 100 nm/min.

33. A method for selectively forming silicon-containing material in a recess, comprising:
  providing a semiconductor substrate into a chemical vapor deposition chamber, the substrate comprising a recess and an adjacent insulating surface;
  depositing silicon-containing material over the recess and adjacent insulating surface by flowing a silicon-containing source vapor and an inert carrier gas in the chamber;
  selectively removing portions of the silicon-containing material from over the insulating surface by flowing HCl and $GeH_4$ with the inert carrier gas without flowing $H_2$; and
  repeating the deposition and selective removal processes in the same chamber until a desired thickness of silicon-containing material is deposited in the recess, wherein the inert gas is flowed continuously throughout the depositing, selectively removing, and repeating.

34. The method of claim 33, wherein the ratio of the rate of etching of silicon-containing material over the insulating surface to the rate of etching silicon-containing material over the recess is between 2:1 and 200:1.

* * * * *